United States Patent
Berry, III et al.

(10) Patent No.: US 10,998,167 B2
(45) Date of Patent: May 4, 2021

(54) ION BEAM ETCH WITHOUT NEED FOR WAFER TILT OR ROTATION

(71) Applicant: Lam Research Corporation, Fremont, CA (US)

(72) Inventors: Ivan L. Berry, III, San Jose, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/384,804

(22) Filed: Apr. 15, 2019

(65) Prior Publication Data

US 2019/0237298 A1    Aug. 1, 2019

Related U.S. Application Data

(60) Division of application No. 14/592,820, filed on Jan. 8, 2015, which is a continuation-in-part of application No. 14/473,863, filed on Aug. 29, 2014, now Pat. No. 9,406,535.

(51) Int. Cl.
  *H01J 37/305* (2006.01)
  *H01J 37/32* (2006.01)
  *H01L 21/311* (2006.01)

(52) U.S. Cl.
  CPC .... *H01J 37/3053* (2013.01); *H01J 37/32009* (2013.01); *H01J 37/32422* (2013.01); *H01J 37/32532* (2013.01); *H01L 21/31116* (2013.01)

(58) Field of Classification Search
  None
  See application file for complete search history.

(56) References Cited

U.S. PATENT DOCUMENTS

| | | |
|---|---|---|
| 3,704,511 A | 12/1972 | Hooker |
| 3,899,711 A | 8/1975 | Lemmond |
| 3,969,646 A | 7/1976 | Reader et al. |
| 4,200,794 A | 4/1980 | Newberry et al. |
| 4,419,580 A | 12/1983 | Walker et al. |

(Continued)

FOREIGN PATENT DOCUMENTS

| | | |
|---|---|---|
| CA | 1157511 | 11/1983 |
| CA | 1184239 | 3/1985 |

(Continued)

OTHER PUBLICATIONS

U.S. Notice of Allowance, dated Jun. 20, 2016, issued in U.S. Appl. No. 14/473,863.

(Continued)

*Primary Examiner* — Andrew Smyth
(74) *Attorney, Agent, or Firm* — Weaver Austin Villeneuve & Sampson LLP

(57) ABSTRACT

Various embodiments herein relate to methods and apparatus for etching feature on a substrate. In a number of embodiments, no substrate rotation or tilting is used. While conventional etching processes rely on substrate rotation to even out the distribution of ions over the substrate surface, various embodiments herein achieve this purpose by moving the ion beams relative to the ion source. Movement of the ion beams can be achieved in a number of ways including electrostatic techniques, mechanical techniques, magnetic techniques, and combinations thereof.

18 Claims, 14 Drawing Sheets

(56) References Cited

U.S. PATENT DOCUMENTS

| | | | |
|---|---|---|---|
| 4,873,445 A * | 10/1989 | Le Jeune | H01J 27/16 250/423 R |
| 5,010,842 A | 4/1991 | Oda et al. | |
| 5,248,371 A * | 9/1993 | Maher | H01J 37/32541 118/723 E |
| 5,284,544 A * | 2/1994 | Mizutani | H01J 37/32357 156/345.38 |
| 5,350,499 A | 9/1994 | Shibaike et al. | |
| 5,472,565 A | 12/1995 | Mundt et al. | |
| 5,675,606 A | 10/1997 | Brainard et al. | |
| 5,811,022 A * | 9/1998 | Savas | H01J 37/321 118/723 I |
| 6,063,710 A | 5/2000 | Kadomura et al. | |
| 6,110,287 A | 8/2000 | Arai et al. | |
| 6,153,474 A | 11/2000 | Ho et al. | |
| 6,235,643 B1 | 5/2001 | Mui et al. | |
| 6,515,426 B1 | 2/2003 | Tanaka et al. | |
| 6,547,977 B1 | 4/2003 | Yan et al. | |
| 6,579,372 B2 | 6/2003 | Park | |
| 6,617,595 B1 | 9/2003 | Okunuki | |
| 6,821,910 B2 | 11/2004 | Adomaitis et al. | |
| 6,965,138 B2 | 11/2005 | Nakajima et al. | |
| 7,037,846 B2 | 5/2006 | Srivastava et al. | |
| 7,320,167 B2 | 1/2008 | Takano | |
| 7,416,989 B1 | 8/2008 | Liu et al. | |
| 7,767,561 B2 | 8/2010 | Hanawa et al. | |
| 7,935,942 B2 | 5/2011 | England et al. | |
| 7,977,249 B2 | 7/2011 | Liu et al. | |
| 7,981,763 B1 | 7/2011 | van Schravendijk et al. | |
| 8,058,179 B1 | 11/2011 | Draeger et al. | |
| 8,187,486 B1 | 5/2012 | Liu et al. | |
| 8,608,973 B1 | 12/2013 | Guha | |
| 8,617,411 B2 | 12/2013 | Singh | |
| 9,406,535 B2 | 8/2016 | Berry, III et al. | |
| 9,536,748 B2 | 1/2017 | Berry, III et al. | |
| 9,564,297 B2 * | 2/2017 | Wu | H01J 37/32422 |
| 9,779,955 B2 | 10/2017 | Lill et al. | |
| 9,837,254 B2 | 12/2017 | Berry, III et al. | |
| 9,916,993 B2 | 3/2018 | Berry, III et al. | |
| 10,580,628 B2 | 3/2020 | Berry, III et al. | |
| 10,825,652 B2 | 11/2020 | Berry, III et al. | |
| 10,847,374 B2 | 11/2020 | Belau et al. | |
| 2001/0006093 A1 | 7/2001 | Tabuchi et al. | |
| 2002/0025681 A1 | 2/2002 | Chi et al. | |
| 2003/0003755 A1 | 1/2003 | Donohoe | |
| 2003/0098126 A1 | 5/2003 | Yeom et al. | |
| 2003/0168588 A1 * | 9/2003 | Brailove | H01J 49/284 250/281 |
| 2004/0065849 A1 | 4/2004 | Larson | |
| 2004/0084410 A1 | 5/2004 | Lenz | |
| 2004/0090607 A1 | 5/2004 | Yoshida | |
| 2004/0161943 A1 | 8/2004 | Ren et al. | |
| 2004/0264044 A1 | 12/2004 | Konishi et al. | |
| 2005/0001527 A1 | 1/2005 | Sugiyama | |
| 2005/0003672 A1 | 1/2005 | Kools et al. | |
| 2005/0032388 A1 | 2/2005 | Donohoe | |
| 2005/0199822 A1 | 9/2005 | Saini et al. | |
| 2005/0211926 A1 | 9/2005 | Ito et al. | |
| 2005/0214478 A1 | 9/2005 | Hanawa et al. | |
| 2005/0218114 A1 | 10/2005 | Yue et al. | |
| 2006/0192104 A1 | 8/2006 | Schultz et al. | |
| 2006/0226120 A1 | 10/2006 | Rusu et al. | |
| 2007/0017636 A1 | 1/2007 | Goto et al. | |
| 2007/0049018 A1 | 3/2007 | Sandhu et al. | |
| 2007/0063337 A1 | 3/2007 | Schubert et al. | |
| 2007/0068624 A1 * | 3/2007 | Jeon | H01J 37/321 156/345.4 |
| 2007/0087574 A1 | 4/2007 | Gupta et al. | |
| 2007/0181820 A1 * | 8/2007 | Hwang | H01J 27/024 250/396 R |
| 2008/0132046 A1 * | 6/2008 | Walther | H01J 37/08 438/513 |
| 2008/0179186 A1 * | 7/2008 | Shimura | H01J 37/08 204/298.04 |
| 2008/0302303 A1 | 12/2008 | Choi et al. | |
| 2009/0053900 A1 | 2/2009 | Nozawa et al. | |
| 2009/0068849 A1 | 3/2009 | Endo et al. | |
| 2009/0203218 A1 | 8/2009 | Matsuyama et al. | |
| 2010/0178770 A1 | 7/2010 | Zin | |
| 2010/0264335 A1 * | 10/2010 | Hoyle | B82Y 10/00 250/492.3 |
| 2011/0100954 A1 * | 5/2011 | Satake | H01J 37/321 216/22 |
| 2011/0201208 A1 | 8/2011 | Kawakami et al. | |
| 2011/0212625 A1 | 9/2011 | Toyoda et al. | |
| 2011/0214814 A1 | 9/2011 | Iizuka et al. | |
| 2012/0126118 A1 | 5/2012 | Suzuki et al. | |
| 2012/0255678 A1 * | 10/2012 | Holland | H01J 37/32596 156/345.33 |
| 2012/0288799 A1 | 11/2012 | Takase et al. | |
| 2013/0137275 A1 | 5/2013 | Tong et al. | |
| 2013/0154037 A1 | 6/2013 | Guha | |
| 2013/0216959 A1 | 8/2013 | Tanaka et al. | |
| 2014/0021343 A1 | 1/2014 | Kirkpatrick et al. | |
| 2014/0070342 A1 | 3/2014 | Sandhu et al. | |
| 2014/0076716 A1 | 3/2014 | Gorokhovsky et al. | |
| 2014/0083978 A1 | 3/2014 | Mahadeswaraswamy et al. | |
| 2014/0093745 A1 | 4/2014 | Fan | |
| 2014/0124363 A1 | 5/2014 | Abarra et al. | |
| 2014/0227866 A1 | 8/2014 | Taylor | |
| 2014/0238637 A1 | 8/2014 | Tanaka | |
| 2014/0356985 A1 | 12/2014 | Ricci et al. | |
| 2015/0123006 A1 * | 5/2015 | Sinclair | H01J 37/077 250/396 R |
| 2015/0179393 A1 * | 6/2015 | Colvin | H01J 37/3171 250/427 |
| 2015/0287911 A1 | 10/2015 | Kim et al. | |
| 2015/0311292 A1 | 10/2015 | Srinivasan et al. | |
| 2016/0035972 A1 | 2/2016 | Lee et al. | |
| 2016/0049281 A1 | 2/2016 | Berry, III et al. | |
| 2016/0064232 A1 | 3/2016 | Berry, III et al. | |
| 2016/0064260 A1 | 3/2016 | Berry, III et al. | |
| 2016/0111294 A1 | 4/2016 | Berry, III et al. | |
| 2016/0181117 A1 | 6/2016 | Arghavani et al. | |
| 2016/0218015 A1 | 7/2016 | Oomori et al. | |
| 2016/0307781 A1 | 10/2016 | Berry, III et al. | |
| 2016/0308112 A1 | 10/2016 | Tan et al. | |
| 2016/0336509 A1 | 11/2016 | Jeong et al. | |
| 2016/0351407 A1 | 12/2016 | Sawataishi et al. | |
| 2016/0351798 A1 | 12/2016 | Shen et al. | |
| 2016/0379856 A1 | 12/2016 | Tomura et al. | |
| 2016/0380028 A1 | 12/2016 | Sonoda et al. | |
| 2017/0047510 A1 | 2/2017 | Chen et al. | |
| 2017/0062181 A1 | 3/2017 | Berry, III et al. | |
| 2017/0148976 A1 | 5/2017 | Annunziata et al. | |
| 2017/0229316 A1 | 8/2017 | Sula et al. | |
| 2017/0250087 A1 | 8/2017 | Lill et al. | |
| 2017/0372911 A1 | 12/2017 | Lill et al. | |
| 2018/0019387 A1 | 1/2018 | Tan et al. | |
| 2018/0047548 A1 | 2/2018 | Berry, III et al. | |
| 2018/0166304 A1 | 6/2018 | Berry, III et al. | |
| 2018/0233662 A1 | 8/2018 | Berry, III et al. | |
| 2018/0286707 A1 | 10/2018 | Hudson et al. | |
| 2019/0131135 A1 | 5/2019 | Belau et al. | |

FOREIGN PATENT DOCUMENTS

| | | |
|---|---|---|
| CN | 2501657 Y | 7/2002 |
| CN | 1577845 A | 2/2005 |
| CN | 1661762 A | 8/2005 |
| CN | 201544052 U | 8/2010 |
| CN | 102422389 A | 4/2012 |
| CN | 102576667 A | 7/2012 |
| CN | 202291523 U | 7/2012 |
| CN | 103154309 A | 6/2013 |
| CN | 103154310 A | 6/2013 |
| CN | 103620730 A | 3/2014 |
| CN | 104282521 A | 1/2015 |
| JP | 06-208837 A | 7/1994 |
| JP | 2003-201957 A | 7/2003 |
| JP | 2005-004068 A | 1/2005 |
| JP | 2009-531535 A | 9/2009 |

(56) References Cited

FOREIGN PATENT DOCUMENTS

| JP | 2011-222960 A | 11/2011 | | |
|---|---|---|---|---|
| JP | 2012-057251 A | 3/2012 | | |
| JP | 2013-514633 A | 4/2013 | | |
| JP | 5432396 | 3/2014 | | |
| JP | 2011-086966 | 8/2014 | | |
| KR | 2009-0033579 A | 4/2009 | | |
| KR | 10-2011-0097193 A | 8/2011 | | |
| KR | 10-2017-0027925 A | 3/2017 | | |
| TW | 200706849 A | 2/2007 | | |
| TW | 200926326 A | 6/2009 | | |
| TW | 2010/09625 A | 3/2010 | | |
| TW | 201044921 A1 | 12/2010 | | |
| TW | 201535811 A | 9/2015 | | |
| TW | 201619433 A | 6/2016 | | |
| TW | 1671427 B | 9/2019 | | |
| WO | WO 94/05035 A1 | 3/1994 | | |
| WO | WO 2007/106076 A2 | 9/2007 | | |
| WO | WO 2010/120805 A2 | 10/2010 | | |
| WO | WO 2012/047882 A2 | 4/2012 | | |
| WO | WO-2012047882 A2 * | 4/2012 | ............ | H01J 27/024 |
| WO | WO-2012047882 A3 * | 6/2012 | .............. | H01J 37/08 |
| WO | WO 2012/151108 A1 | 11/2012 | | |
| WO | WO 2013/012620 A1 | 1/2013 | | |

OTHER PUBLICATIONS

U.S. Office Action, dated Jul. 27, 2017, issued in U.S. Appl. No. 15/191,176.
U.S. Notice of Allowance, dated Nov. 16, 2017, issued in U.S. Appl. No. 15/191,176.
U.S. Office Action, dated May 8, 2017, issued in U.S. Appl. No. 14/458,161.
U.S. Notice of Allowance, dated Aug. 31, 2017, issued in U.S. Appl. No. 14/458,161.
U.S. Office Action, dated Feb. 17, 2016, issued in U.S. Appl. No. 14/520,070.
U.S. Final Office Action, dated Jun. 28, 2016, issued in U.S. Appl. No. 14/520,070.
U.S. Notice of Allowance, dated Aug. 17, 2016, issued in U.S. Appl. No. 14/520,070.
U.S. Notice of Allowance, dated Nov. 23, 2016, issued in U.S. Appl. No. 14/520,070.
U.S. Office Action, dated Jan. 24, 2019, issued in U.S. Appl. No. 15/351,882.
U.S. Office Action, dated Jun. 14, 2016, issued in U.S. Appl. No. 14/592,820.
U.S. Final Office Action, dated Nov. 28, 2016, issued in U.S. Appl. No. 14/592,820.
U.S. Office Action, dated May 11, 2017, issued in U.S. Appl. No. 14/592,820.
U.S. Notice of Allowance, dated Jul. 3, 2017, issued in U.S. Appl. No. 15/054,023.
U.S. Notice of Allowance [Supplemental Notice of Allowability], dated Jul. 19, 2017, issued in U.S. Appl. No. 15/054,023.
U.S. Notice of Allowability dated Sep. 7, 2017, issued in U.S. Appl. No. 15/054,023.
U.S. Office Action dated Feb. 5, 2018 issued in U.S. Appl. No. 15/475,021.
U.S. Final Office Action dated Aug. 7, 2018 issued in U.S. Appl. No. 15/475,021.
U.S. Notice of Allowance dated Mar. 26, 2019, issued in U.S. Appl. No. 15/903,865.
Chinese First Office Action dated Nov. 2, 2016 issued in Application No. CN 201510548855.2.
Chinese Second Office Action dated Apr. 21, 2017 issued in Application No. CN 201510548855.2.
Chinese First Office Action dated Dec. 29, 2018 issued in Application No. CN 201710917663.3.
Chinese First Office Action dated Dec. 18, 2018 issued in Application No. CN 201710920105.2.
Taiwanese First Office Action dated Feb. 20, 2019 issued in Application No. TW 104128248.
Chinese First Office Action dated Aug. 25, 2017 issued in Application No. CN 201510494523.0.
Chinese Second Office Action dated Apr. 20, 2018 issued in Application No. CN 201510494523.0.
Taiwan First Office Action dated Jan. 17, 2019 issued in Application No. TW 104126021.
Chinese First Office Action dated Aug. 25, 2017 issued in Application No. CN 201510546899.1.
Chinese Second Office Action dated Jun. 20, 2018 issued in Application No. CN 201510546899.1.
Chinese Third Office Action dated Jan. 14, 2019 issued in Application No. CN 201510546899.1.
Chinese First Office Action dated Nov. 27, 2017 issued in Application No. CN 201510684338.8.
Chinese Second Office Action dated Aug. 10, 2018 issued in Application No. CN 201510684338.8.
Taiwan First Office Action dated Mar. 6, 2019 issued in Application No. TW 104134288.
Chinese First Office Action dated Oct. 26, 2018 issued in Application No. CN 201710103518.1.
International Search Report and Written Opinion dated Jun. 29, 2018 issued in Application No. PCT/US18/22239.
Engelhardt et al. (1988) "Deep Trench Etching Using $CBrF_3$ and $CBrF_3$/Chlorine Gas Mixtures," *Siemens AG*, Otto-Hahn-Ring, 8000 Munich 83, Germany, pp. 48-54.
Matsuo (May 1, 1980) "Selective etching of Si relative to $SiO_2$ without undercutting by $CBrF_3$ plasma," *Applied Physics Letters*, 36(9):768-770.
Ohiwa et al. (1990) "SiO2 Tapered Etching Employing Magnetron Discharge," *1990 Dry Process Symposium*, ULSI Research Center, Toshiba Corp., V-3, pp. 105-109.
Ohiwa et al. (Feb. 1992) "SiO2 Tapered Etching Employing Magnetron Discharge of Fluorocarbon Gas," *Jpn. J. Appl. Phys.*, 31(Part 1, 2A):405-410.
U.S. Appl. No. 15/798,831, filed Oct. 31, 2017, Belau et al.
U.S. Office Action, dated Nov. 29, 2019, issued in U.S. Appl. No. 15/880,266.
U.S. Final Office Action, dated Apr. 23, 2020, issued in U.S. Appl. No. 15/880,266.
U.S. Office Action, dated Jul. 10, 2019, issued in U.S. Appl. No. 15/793,506.
U.S. Notice of Allowance, dated Oct. 28, 2019, issued in U.S. Appl. No. 15/793,506.
U.S. Notice of Allowance, dated Jul. 10, 2019, issued in U.S. Appl. No. 15/351,882.
U.S. Notice of Allowance, dated Nov. 25, 2019, issued in U.S. Appl. No. 14/592,820.
U.S. Office Action, dated May 8, 2020, issued in U.S. Appl. No. 15/682,369.
U.S. Office Action dated Sep. 17, 2019, issued in U.S. Appl. No. 15/798,831.
U.S. Final Office Action dated Jan. 3, 2020 issued in U.S. Appl. No. 15/798,831.
U.S. Advisory Action dated Mar. 3, 2020 issued in U.S. Appl. No. 15/798,831.
U.S. Office Action dated Apr. 29, 2020 issued in U.S. Appl. No. 15/798,831.
Chinese Second Office Action dated Oct. 8, 2019 issued in Application No. CN 201710917663.3.
Chinese Second Office Action dated Aug. 26, 2019 issued in Application No. CN 201710920105.2.
Chinese First Office Action dated May 29, 2020 issued in Application No. CN 201811027616.2.
Taiwan First Office Action dated Oct. 15, 2019 issued in Application No. TW 108120628.
Japanese First Office Action dated May 28, 2019 issued in Application No. JP 2015158951.
Taiwanese First Office Action dated May 3, 2019 issued in Application No. TW 104128242.
Taiwanese First Office Action dated Apr. 8, 2020 issued in Application No. TW 108145644.

(56) References Cited

OTHER PUBLICATIONS

International Preliminary Report on Patentability dated Oct. 10, 2019 issued in Application No. PCT/US2018/022239.
Jim McVittie "Tutorial on Using RF to Control DC Bias" (2007) found in Web-page "https://nccavs-usergroups.avs.org/wp-content/uploads/PAG2007/PEUG_07_5_McVittie.pdf" Used Only as Evidence. (Year: 2007).
Mantzaris et al., "Radio-Frequency Plasmas in CF 4: Self-consistent modeling of the plasma physics and chemistry," J. Appl. Phys., n(12). Jun. 15, 1995, pp. 6169-6180. (used only as evidence). <URL: https://doi.org/10.1063/1.359143>.
U.S. Office Action dated Sep. 24, 2020 issued in U.S. Appl. No. 15/880,266.
U.S. Final Office Action dated Nov. 2, 2020 issued in U.S. Appl. No. 15/682,369.
U.S. Office Advisory Action, dated Jul. 14, 2020, issued in U.S. Appl. No. 15/880,266.
U.S. Notice of Allowance, dated Jun. 15, 2020, issued in U.S. Appl. No. 14/592,820.
U.S. Notice of Allowance dated Aug. 5, 2020 issued in U.S. Appl. No. 15/798,831.
Taiwanese First Office Action dated Jun. 23, 2020 issued in Application No. TW 106105506.
International Search Report and Written Opinion dated Jun. 24, 2020 issued in Application No. PCT/US2020/019927.
Merriam-Webster Online Dictionary definition: "over" (Accessed Sep. 21, 2020).

\* cited by examiner

ION BEAM ETCH WITHOUT NEED FOR WAFER TILT OR ROTATION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Fabrication of semiconductor devices typically involves a series of operations in which various materials are deposited onto and removed from a semiconductor substrate. One technique for material removal is ion beam etching, which involves delivering ions to the surface of a substrate to physically and/or chemically remove atoms and compounds from the surface in an anisotropic manner. The impinging ions strike the substrate surface and remove material through momentum transfer (and through reaction in the case of reactive ion etching).

SUMMARY

Various embodiments herein relate to methods and apparatus for etching material on semiconductor substrates. In one aspect of the embodiments herein, an ion beam etching apparatus for etching material on semiconductor substrates is provided, the apparatus including: a reaction chamber; a substrate support in the reaction chamber; an ion source including: a plasma region for generating and/or maintaining a plasma, and an ion extractor positioned proximate the plasma region, the ion extractor including: a first electrode, a second electrode, and an optional third electrode, each of the first, second, and third electrodes including a plurality of apertures therein, and a power supply configured to supply a bias potential to one or more of the first electrode, second electrode, and third electrode, where the ion source is configured to generate a plurality of ion beams emanating from the plurality of apertures in the first, second, and third electrodes; and a controller having instructions to: (a) generate the ion beams such that the ion beam trajectories are deflected to a non-normal angle with respect to a lowermost electrode of the ion extractor, the lowermost electrode being one of the first electrode, second electrode, and third electrode, and to (b) alter the ion beam trajectories such that the ion beams move with respect to the orientation of the ion source during etching.

In certain embodiments, the third electrode is an off-center aperture electrode, where apertures in the third electrode are offset from apertures in the first and second electrodes. In some such embodiments, the instructions in (a) include applying a bias to the off-center aperture electrode to thereby cause the ion beams to emanate from the plurality of apertures in the lowermost electrode at a non-normal angle. In these or other cases, the instructions in (b) may include varying the bias applied to the off-center aperture electrode during etching to thereby move the ion beams with respect to the orientation of the ion source and substrate surface.

Mechanical techniques may also be used. For instance, the instructions in (b) may include mechanically moving the third electrode during etching to thereby move the ion beams with respect to the orientation of the ion source and substrate surface. In various implementations, one or more electromagnetic coils may be used in achieving (a) and/or (b). In some examples, the apparatus further includes one or more electromagnetic coils positioned outside the reaction chamber to generate a magnetic field in a region between the ion source and the substrate support, and the instructions in (b) include instructions to vary the strength of the magnetic field to thereby move the ion beams with respect to the orientation of the ion source and substrate surface.

In some cases, more than one off-center aperture electrode may be used. For example, the apertures in the third electrode may be offset from apertures in the first and second electrodes in a first direction, where the apparatus further includes a fourth electrode that is an off-center aperture electrode with apertures that are offset from apertures in the first and second electrodes in a second direction, where the first direction is different from the second direction.

Deflection plates provide an additional or alternative mechanism to deflect the ion beams. In some embodiments, the ion source further includes sets of deflection plates provided below the lowermost electrode, where the instructions in (a) include generating electric fields between the deflection plates in each set of deflection plates, and where the ion beams travel through the electric fields. In various cases, the instructions in (b) may include instructions to vary the strength of the electric fields between the deflection plates in each set of deflection plates to thereby move the ion beams with respect to the orientation of the ion source and substrate surface. The deflection plates may take various forms. In some embodiments, the deflection plates are provided in one or more arrays of parallel conductive bars. In a particular embodiment, the deflection plates are provided in a first array of parallel conductive bars and a second array of parallel conductive bars, the first and second arrays being oriented perpendicular to one another. In another embodiment, the deflection plates are provided as conductive plates at least partially positioned within holes in an insulating plate.

As noted above, electromagnetic coils may be used in various cases. In some embodiments, the apparatus further includes one or more electromagnetic coils positioned outside the reaction chamber to generate a magnetic field between the ion source and the substrate support, and the instructions in (b) include instructions to vary the strength of the magnetic field between the ion source and the substrate support to thereby alter the ion beam trajectories in a region between the ion source and the substrate support. In these or other cases, the apparatus may further include one or more electromagnetic coils positioned outside the reaction chamber to generate a first magnetic field proximate the ion source, where the instructions in (a) include generating the first magnetic field to cause the ion beams to deflect. The instructions in (b) may include varying the strength of the first magnetic field to thereby move the ion beams with respect to the orientation of the ion source and substrate surface. In some embodiments, the apparatus further includes one or more additional electromagnetic coils positioned outside the reaction chamber to generate a second magnetic field between the ion source and the substrate support, and the instructions in (b) include instructions to vary the strength of the second magnetic field to thereby move the ion beams with respect to the orientation of the ion source and substrate surface.

In various cases, the substrate support is not configured to tilt the substrate during etching. In these or other cases, the substrate support is not configured to rotate the substrate during etching. These features may significantly simplify the etching method and/or the apparatus for practicing the etching method. In any of the disclosed embodiments, a hollow cathode emitter electrode may be present in the ion source. Another modification that may be made to any of the disclosed embodiments is an injection head. In certain embodiments, the apparatus further includes an injection head for providing reactants to the substrate in the reaction chamber at a local high pressure, where the controller further includes instructions to maintain the reaction chamber below a processing pressure, where the local high pressure is at least about 100 times higher than the processing pressure. In some implementations, the ion beams emanating from apertures in the lowermost electrode emanate parallel to one another.

In another aspect of the disclosed embodiments, a method for etching material on a semiconductor substrate is provided, the method including: (a) generating a plasma; (b) generating ion beams from the plasma using an ion source including at least two electrodes, each electrode having a plurality of apertures therein, the ion beams having ion beam trajectories that are deflected to a non-normal angle with respect to a lowermost electrode of the ion source; and (c) altering the ion beam trajectories such that the ion beams move with respect to the orientation of the ion source during etching.

In various embodiments, the substrate does not rotate during etching. In these or other embodiments, the substrate does not tilt during etching.

These and other features will be described below with reference to the associated drawings.

DETAILED DESCRIPTION

Figure 1:
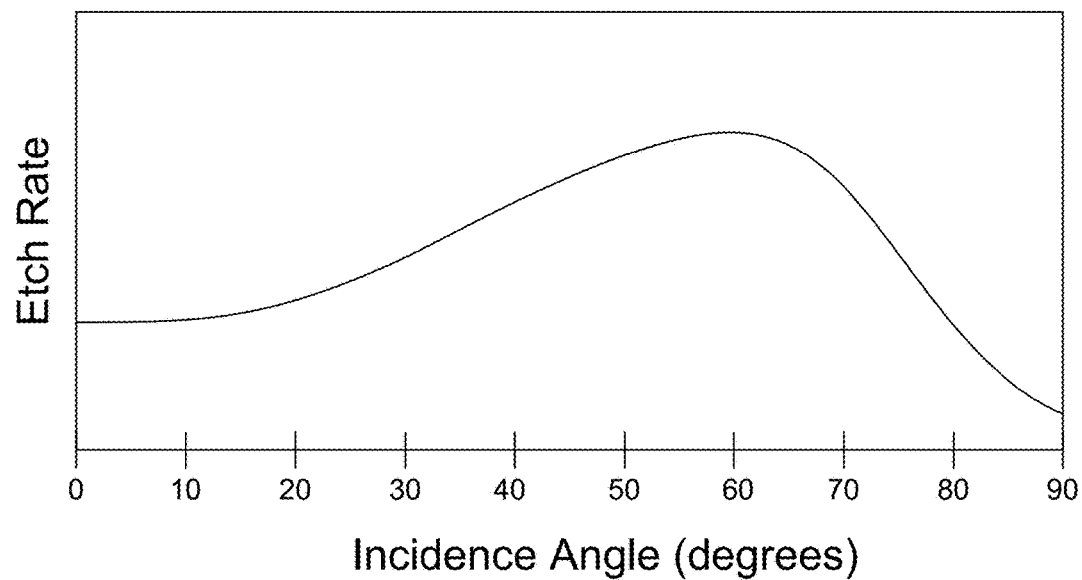
FIG. 1 is a graph depicting the etch rate vs. incidence angle for ion beam etching processes.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micromechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

I. Context

Ion beam etching is commonly used in fabrication of magnetic devices. As mentioned above, ion beam etching involves removing material from the surface of a substrate by delivering energetic ions to the substrate surface. Ion beam etching may be broadly categorized into processes that solely involve inert ions (e.g., argon ions), and processes that involve reactive ions or chemical reactions initiated by ions (e.g., oxygen ions, certain ionized compounds such as fluorine-containing ionized compounds, reactive or inert ions initiating a chemical reaction with a reactant chemisorbed or physisorbed on the surface on the substrate, etc.). In these of processes, ions impinge on the substrate surface and remove material through either direct physical momentum transfer (sputtering) or a chemical reaction initiated by the energy transfer from the ions (reactive ion beam etching or chemically assisted ion beam etching). Reactive ion beam etching (RIBE) typically involves utilization of an ion that can chemically react with the substrate (such as oxygen, fluorine and the like). In chemically assisted ion beam etching (CAIBE), an inert ion either initiates a chemical reaction between the substrate and a reactant (such as an applied gas that is adsorbed on the surface), or generates a reactive site on the surface of the substrate that reacts with an applied reactant coincident with or subsequent to the generation of the reactant site, or any combination thereof.

Certain applications for ion beam etching processes relate to etching of non-volatile materials. In some cases, the material etched is a conductive material. In certain embodiments, the material is etched in the context of forming a magnetoresistive random-access memory (MRAM) device, a spin-torque-transfer memory device (STT-RAM), a phase-change memory device (PSM), a non-volatile conductor (copper, platinum, gold, and the like). In other applications, the ability to control the ion incident angle to the substrate can be useful in generating 3D devices such as vertically stacked memory.

When performing ion beam etching processes, it is desirable to promote a highly uniform ion flux over the substrate surface. A high degree of uniformity is beneficial in creating reliable devices across the entire surface of the substrate. Further, it may be desirable in certain cases to promote a high ion flux and/or a high flux of a gas phase reactant. High flux can help maximize throughput. Another factor that affects the quality of the etching results is the ability to control the energy and angle at which the ions impact the surface. These factors are important in forming features having desired dimensions and profiles.

Figure 2:
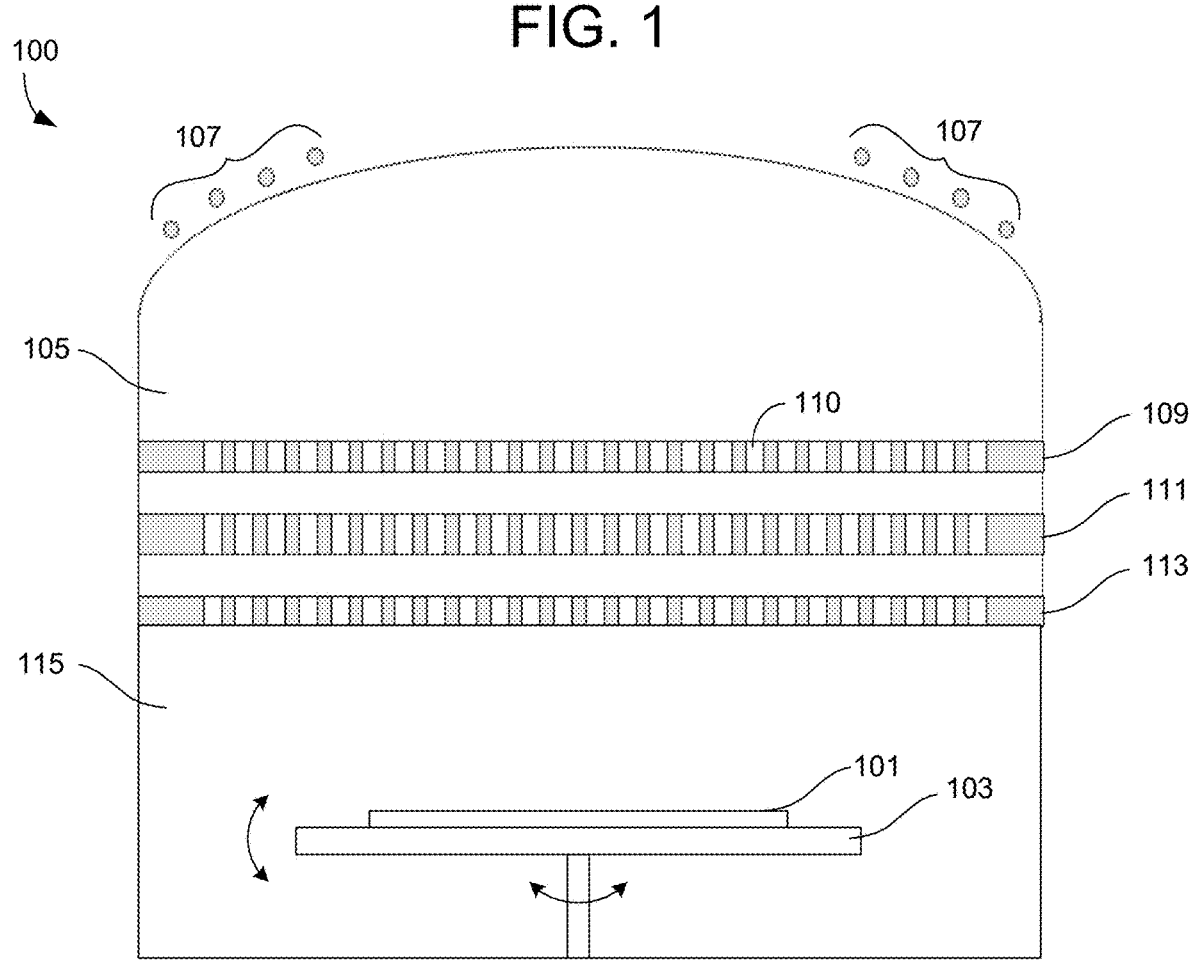
FIG. 2 illustrates a simplified view of a reaction chamber for performing certain ion beam etching processes.

FIG. 2 presents a simplified cross-sectional view of an apparatus 100 for performing ion beam etching in certain methods. In this example, substrate 101 rests on substrate support 103, which may be equipped with hardware (not shown) to provide electrical and fluidic connections. The electrical connections may be used to supply electricity to the substrate support 103 or to an electrostatic chuck located on or within the substrate support 103 (not shown) in some cases, while the fluidic connections may be used to provide fluids used to control the temperature of the substrate 101 and substrate support 103. The substrate support 103 may be heated by a heater (not shown) or cooled by a cooling mechanism (not shown). The cooling mechanism may involve flowing cooling fluids through piping in or adjacent the substrate support 103. The substrate support 103 may be capable of rotating and tilting at variable speeds and angles, as indicated by the double headed arrows in FIG. 1.

A plasma generation gas is delivered to a primary plasma generation region 105. The plasma generation gas is energized by a plasma source 107. In the context of FIG. 1, the plasma source 107 is a coil that acts as an inductively coupled plasma source. Other sources such as capacitively coupled sources, microwave sources or discharge sources may be employed in appropriately designed reactors. Plasma forms in the primary plasma generation region 105. An extraction electrode 109 includes a series of apertures 110 through which ions are extracted.

The apertures 110 may have a diameter between about 0.5-1 cm, and a height that is defined by the thickness of the electrode. The apertures 110 may have a height to width aspect ratio (AR) between about 0.01-100.0. In some cases the apertures 110 are arranged in a hexagonal, square grid, or spiral pattern, though other patterns may be used as well. A center-to-center distance between neighboring apertures may be between about 1 mm-10 cm. The apertures may be configured to achieve an overall open area (i.e., sum of the area of each aperture) that is between about 0.1%-95% of the surface area of the electrode when considering only a single (top or bottom) face of the electrode. For example, an electrode having a diameter of 40 cm and 500 holes each having a diameter of 1 cm will have an open area of about 31% (393 $cm^2$ open area divided by 1257 $cm^2$ total area). The apertures 110 may have different diameters in different electrodes. In some cases, the aperture diameter is smaller in upper electrodes and larger in lower electrodes. In one embodiment, the apertures in a lower electrode 113 are larger than the apertures in a focus electrode 111 (e.g., between about 0-30% larger). In these or other cases, the apertures in the focus electrode 111 are larger than the apertures in the extraction electrode 109 (e.g., between about 0-30% larger).

The bias $V_1$ applied to the extraction electrode 109 with respect to the substrate 101 acts to provide kinetic energy to the ion with respect to the substrate. This bias is generally positive and can range between about 20-10,000 volts or more. In certain cases the bias on the extraction electrode is between about 20-2,000 volts. Positive ions in the plasma above extraction electrode 109 are attracted to the lower electrode 113 by the potential difference between electrodes 109 and 113. Focus electrode 111 is added to focus the ions, and if needed, repel electrons. A bias $V_2$ on this electrode can be either positive or negative with respect to the extraction electrode 109, but is generally biased negatively. The bias potential of focus electrode 111 is determined by the lensing characteristics of the focusing electrode 111. Bias voltages on the focus electrode include positive voltages between about 1.1× to 20× the potential $V_1$ on the extraction electrode, and negative voltages having a magnitude between about 0.001× to 0.95× the potential of $V_1$. Due to the different potentials applied to the different electrodes, a potential gradient exists. The potential gradient may be on the order of about 1000 V/cm. Example separation distances between neighboring electrodes fall between about 0.1-10 cm, or for example about 1 cm.

After the ions leave the bottom of the grounded lower electrode 113 in most conventional ion beam etching operations, they travel in a collimated and focused beam. Alternatively the beam can be made divergent if the focus electrode voltage is adjusted to either under- or over-focus the ion beam. In the embodiments herein, the ion beams may be either divergent or collimated. In certain implementations, the divergence of the ion beam may be at least about 5°, at least about 10°, at least about 15°, or at least about 20°. In these or other cases, the divergence of the ion beams may be about 30° or less, for example about 25° or less, or about 20° or less, or about 15° or less. The lower electrode 113 is grounded in many (but not all) cases. The use of a grounded lower electrode 113 in combination with a grounded substrate 101 results in a substrate processing region 115 that is substantially (electrostatically) field free. Having the substrate located in a field-free region prevents electrons or secondary ions generated by collisions between the ion beam with residual gases or with surfaces in the reaction chamber from being accelerated towards the substrate, thereby minimizing the risk of causing unwanted damage or secondary reactions.

Additionally, it is important to prevent the substrate 101 from charging from the ion beam itself, or from ejected secondary electrons generated during the ion beam collision with the substrate. Neutralization is typically accomplished by adding a low energy electron source (not shown) in the vicinity of the substrate 101. Since the positive charge on the ion and the ejected secondary electrons both charge the substrate positively, low energy electrons in the vicinity of the substrate can be attracted to the positively charged surface and can neutralize this charge. Performing this neutralization is much easier in a field free region.

In some applications it may be desirable to have a potential difference between the lower electrode 113 and substrate 101. For example, if very low energy ions are required, it is difficult to maintain a well-collimated beam at low energy over long distances due to mutual repulsion of the positively charged ions (space-charge effects). One solution to this is to place a negative bias on the lower electrode 113 with respect to substrate 101 (or conversely biasing substrate 101 positively with respect to the lower electrode 113). This allows extracting the ions at higher energy, then slowing them down as they approach the substrate.

In certain ion beam etching operations, one of the three electrodes may be omitted. Where this is the case, there is less flexibility regarding the energy at which ions are directed to the surface of the substrate. This limitation arises because in order for the ions to be focused and directed as desired, a particular ratio of bias potentials should be applied to the two electrodes. The ratio of bias potentials is controlled by the focusing characteristics and geometries of the two electrodes. As such, where a particular geometry is used and a particular bias/electrical state is desired on the lower electrode (e.g., grounded), there is little or no flexibility in the bias applied to the upper electrode. The result is that a reaction chamber using such a setup is limited in the range of ion energy that may be imparted to ions as they travel through the various electrodes. The introduction of a third electrode allows the ions to be focused/directed as desired at many different ion energies, as described above.

In other ion beam etching operations, one or more additional electrodes may be provided. One such electrode may be an electrode having apertures that are off-center compared to apertures in the remaining electrodes. This off-center aperture electrode, and the voltage applied to it, may be used to control the angle at which the ion beams leave the electrodes and travel toward the substrate. The off-center aperture electrode is discussed in further detail below. Another type of electrode that may be used, and which is not shown in FIG. 2, is a hollow cathode emitter electrode. In a hollow cathode emitter electrode, each aperture on the electrode is a hollow cathode emitter. The hollow cathode emitters may be used to form local plasmas from which ions are efficiently extracted to form the ion beams. The hollow cathode emitter electrode is discussed in further detail below.

Each of the electrodes 109, 111, and 113 has a thickness, which may be between about 0.5 mm-10 cm, or between about 1 mm-3 cm, for example about 5 mm. The electrodes 109, 111, and 113 may each be the same thickness, or they may have different thicknesses. Further, the separation distance between the extraction electrode 109 and the focus electrode 111 may be the same, greater, or less than the separation distance between the focus electrode 111 and the lower electrode 113. Each electrode 109, 111, and 113 also has dimensions, which may be less than, equal to or greater than the dimensions of the substrate being processed. In certain embodiments, the electrodes' dimensions are close to that of the substrate or substrate support (e.g., within about 50%).

The electrodes 109, 111, and 113, may be circular, rectangular or other polygonal shape. The electrodes may be collectively referred to as an ion extractor. The ion extractor and the plasma generation region 105 may together be referred to as the ion source. In certain embodiments the electrodes are long and narrow, wherein the long dimension is approximately equal to or greater than one dimension of the substrate, and the substrate is scanned in the orthogonal direction such that the ion beam strikes uniformly across the substrate surface when averaged over time.

The apertures 110 in the extraction electrode 109, focus electrode 111 and lower electrode 113 may be precisely aligned with one another. Precise alignment of the apertures is used in conventional applications to ensure that the ion beams leave the electrodes at a normal angle. In certain embodiments herein, an off-center aperture electrode is purposely included. The off-center electrode may be used to control the angle at which the ion beams leave the electrodes and travel toward the substrate, as discussed further below.

Ion beam etching processes are typically run at low pressures. In some embodiments, the pressure may be about 100 mTorr or less, for example about 1 mTorr or less, and in many cases about 0.1 mTorr or less. The low pressure helps minimize undesirable collisions between ions and any gaseous species present in the substrate processing region.

Conventional ion beam etching processes generally involve tilting and rotating a substrate during etching. As explained in further detail below, various embodiments herein relate to methods and apparatus for performing ion beam etching where no substrate rotation or tilting is needed. In conventional approaches, substrate tilting is used to control the incidence angle of the ions impacting the substrate and thereby control the etch rate and resulting profile of etched features. As shown in FIG. 1, the etch rate is dependent upon the incidence angle, with the fastest etching occurring at an incidence angle of about 60°. The incidence angle is measured as the angle between the ion trajectory and the normal of the substrate surface. For instance, if a substrate is maintained in a horizontal position and the ions impinge upon the surface in a direction directly downward/vertical, the incidence angle is 0°. If the substrate is tilted by 10° and the ions travel directly downward, the incidence angle is 10°.

In many cases where vertical features are formed, multiple tilt angles are used during a single etching operation, with the substrate rotating during the etch. A first tilt angle may be used to form the sidewalls of the etched feature, and a second tilt angle may be used to clean up/shape certain areas in the feature, such as a shoulder area near the bottom sidewalls of the feature. This shaping may be beneficial for removing certain species that redeposit (e.g., through back sputtering) onto the sidewalls of the feature during etching. Other angles may be used during a single etching process, as well. Substrate rotation is used to even out ion beam coverage over the surface of the wafer, making the ion flux over the substrate surface more uniform. This tilting and rotation can introduce significant processing difficulties.

Certain processing difficulties that arise from substrate rotation relate to electrical and fluidic connections on or within a substrate support. These connections may be used during an etching process to clamp the substrate, provide power, cooling fluids, etc. to the substrate support. When a substrate is rotated on the substrate support, these connections may undesirably twist and/or wind around themselves, the substrate support, or other mechanisms in the reaction chamber. This twisting and/or winding may prevent the substrate from rotating continuously in one direction. One solution to this problem relates to the use of bi-directional rotation during etching, as related in U.S. patent application Ser. No. 14/473,863, incorporated by reference above. However, bi-directional rotation may introduce other difficulties related to accurately controlling the relative rotational position of the substrate during an etching process. For instance, an optical or mechanical positional tracking system may be used to accurately track the rotational position of the substrate in order to ensure that the substrate switches directions at appropriate times during etching. These tracking systems add complexity and cost to the etching apparatus. Bi-directional rotation may also introduce certain processing non-uniformities, particularly if the substrate cannot switch directions sufficiently quickly, or if rotational velocity non-uniformities during rotation are too extensive.

Another processing difficulty relating to substrate rotation arises in the context of CAIBE. As explained in U.S. patent application Ser. No. 14/458,161, filed Aug. 12, 2014, and titled "DIFFERENTIALLY PUMPED REACTIVE GAS INJECTOR," which is herein incorporated by reference in its entirety, it is often desirable to maintain a low pressure in the processing chamber to minimize collision of ions in the ion beams with other species in the chamber. On the other hand, it is desirable to deliver reactant gases (where used) at relatively higher pressures to increase the rate of reaction. One solution, as presented in the Ser. No. 14/458,161 application, is to use a local reactant delivery mechanism to locally deliver reactants to the surface of the substrate. The local reactant delivery mechanism (also referred to as an injection head or a differentially pumped reactive gas injector) may be positioned at a close proximity to the substrate surface such that the reactant is delivered very close to the substrate. The injection head typically has at least two regions: a reactant delivery region and a vacuum region. The vacuum region may surround, substantially surround, and/or abut the reactant delivery region. Further details related to the injection head are included below.

Although the injection head can advantageously deliver reactants at local high pressures, the injection head may be difficult to implement where substrate rotation and tilting is used. This difficulty may relate to achieving uniform reactant delivery over the substrate surface, and may be most problematic in embodiments where the substrate rotates under an injection head that moves to scan over the surface of the substrate, and in embodiments where the substrate goes through multiple tilt angles during etching. By contrast, where the substrate does not rotate or tilt, it may be much easier to configure the injection head to uniformly deliver reactants to the substrate surface (i.e., simpler scanning patterns and/or simpler injection head designs and support/positioning mechanisms may be used).

Based on these and other difficulties, an improved etching process is desired, where no substrate rotation and/or tilting is used. Advantageously, an apparatus that does not employ substrate rotation and/or tilting would be less complex and less costly than a conventional ion beam etching apparatus.

II. Improved Ion Beam Etching Processes and Apparatus

Certain embodiments herein relate to ion beam etching processes and apparatus that do not involve substrate rotation during etching. In order to provide uniform ion flux over the surface of the substrate, one or more of several options may be used. These options may be broadly categorized into electrostatic techniques, mechanical techniques, and magnetic techniques, and are further discussed below. In certain embodiments, the ion beams are divergent. In other embodiments, more collimated ion beams may be used. Certain additional features may be integrated into the etching apparatus to further improve the etching results. One such feature may be a hollow cathode emitter electrode. Another such feature may be an injection head for delivering reactants at a local high pressure in the substrate. Each of these options and features are discussed further below.

A. Divergent Ion Beams

Figures 3A, 3B, 3C:
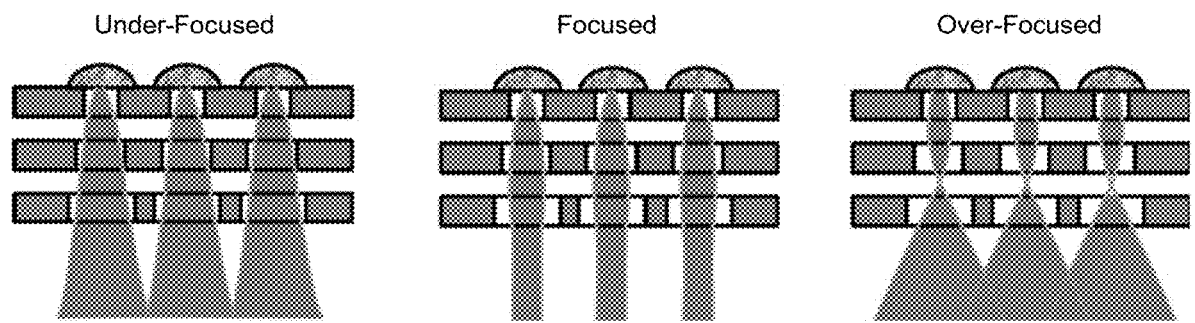
FIGS. 3A-3C depict ion beams that are under-focused (FIG. 3A), focused (FIG. 3B), or over-focused (FIG. 3C).

FIGS. 3A-3C depict an ion extractor having three electrodes with apertures therein. In FIG. 3A, the ion beam is under-focused. In FIG. 3B, the ion beam is focused (i.e., collimated). In FIG. 3C, the ion beam is over-focused. Both under- and over-focused ion beams may be referred to as divergent beams. Divergent beams may be particularly useful where no substrate rotation or other method of evening out the ion coverage is used (though divergent beams are not limited to this context). Highly focused ion beams provide ions over a relatively small area for each ion beam. If no substrate rotation or other method of evening out the ion distribution is used, etching will occur only in areas where the focused ion beams impinge upon the substrate, and no etching will occur in regions between these areas. This result is highly undesirable. The under- and over-focused ion beams, by contrast, deliver ions over a wider range of effective ion distribution angles, and can therefore be used to ensure that the ion beams impinge upon the entire surface of the substrate. However, even divergent ion beams deliver ions with a certain degree of non-uniformity. This non-uniformity arises because relatively more ions are delivered down the centerline of the beam, and relatively fewer ions are delivered near the edges of the beam.

Immediately above each aperture in FIGS. 3A-3C is a hemi-spherical region sometimes referred to as a dark space. The dark space may be present above the uppermost electrode (e.g., above the extraction electrode, or above a hollow cathode emitter electrode, where used). The dark space is a region where no plasma exists. The charged particle density in these regions is very low. Electrons are repelled from this region because a negative potential emanating from a position below the uppermost electrode extends through the apertures and repels electrons from the plasma. Similarly, ions in the plasma are rapidly attracted into and accelerated through the apertures. These two effects (repulsion of electrons and attraction/acceleration of positive ions) combine to form a region where there is no plasma, i.e., the dark space.

Figure 4:
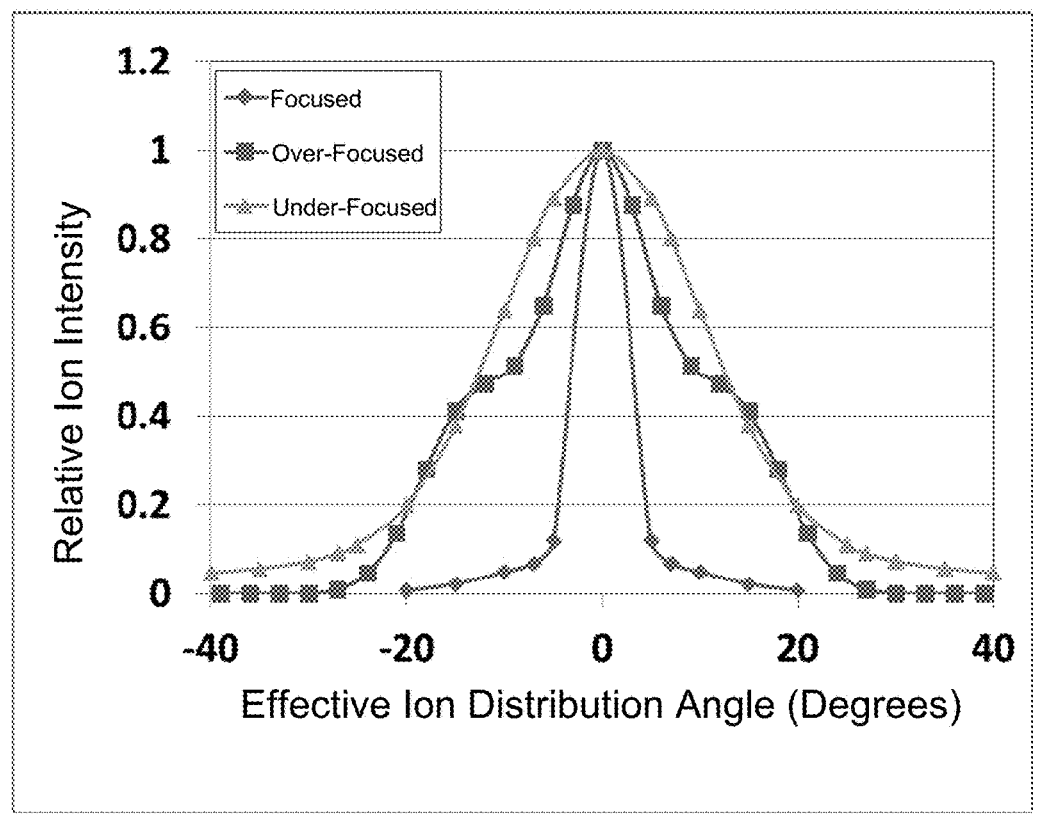
FIG. 4 is a graph showing the relative ion intensity vs. effective ion distribution angle for the types of beams shown in FIGS. 3A-3C.

FIG. 4 presents a graph showing the relative ion intensity over the effective ion distribution angles for the types of ion beams shown in FIGS. 3A-3C, where the effective ion distribution angle is the angular distribution of ions that strike the substrate emanating from one of the ion extraction apertures. As shown in FIG. 4, under- and over-focused beams provide substantially greater ion intensity at the larger distribution angles.

Figure 5:
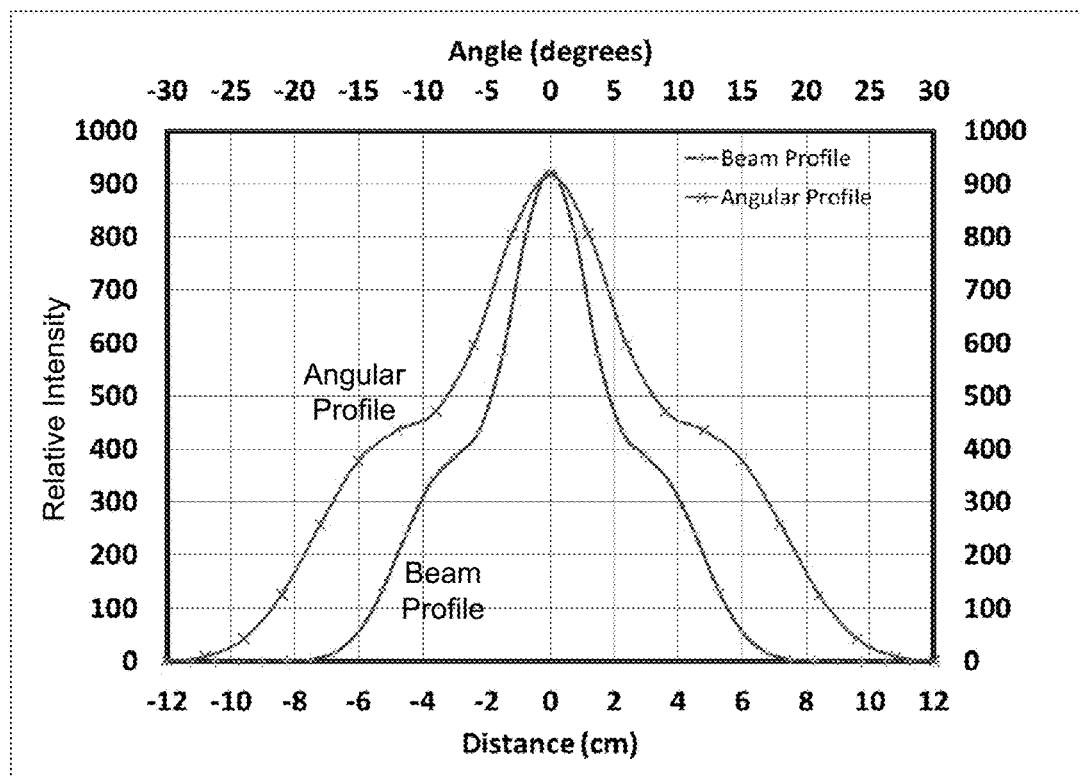
FIG. 5 is a graph showing the ion beam profile and angular profile for a divergent ion beam.

FIG. 5 presents similar information to what is shown in FIG. 4. In particular, FIG. 5 shows the beam profile and angular profile for an over-focused divergent ion beam. The beam profile is the ion intensity distribution striking the substrate emanating from one of the ion extraction apertures. The angular profile is the ion angular distribution relative to the substrate surface normal for ions emanating from one of the ion extraction apertures. The data were generated assuming a grid to wafer distance of about 15 cm, a lens focal length of about 2 cm, an electrode aperture dimension of about 0.5 cm, with about 3 eV energy spread. Nominal values were assumed for spherical and chromatic aberration and space charge. As shown in FIGS. 4 and 5, the ion intensity is highest at the center-line of the beam (x=0), where the effective ion distribution angle is 0. This is true for all the types of beams shown in FIGS. 3A-3C.

Figure 6:
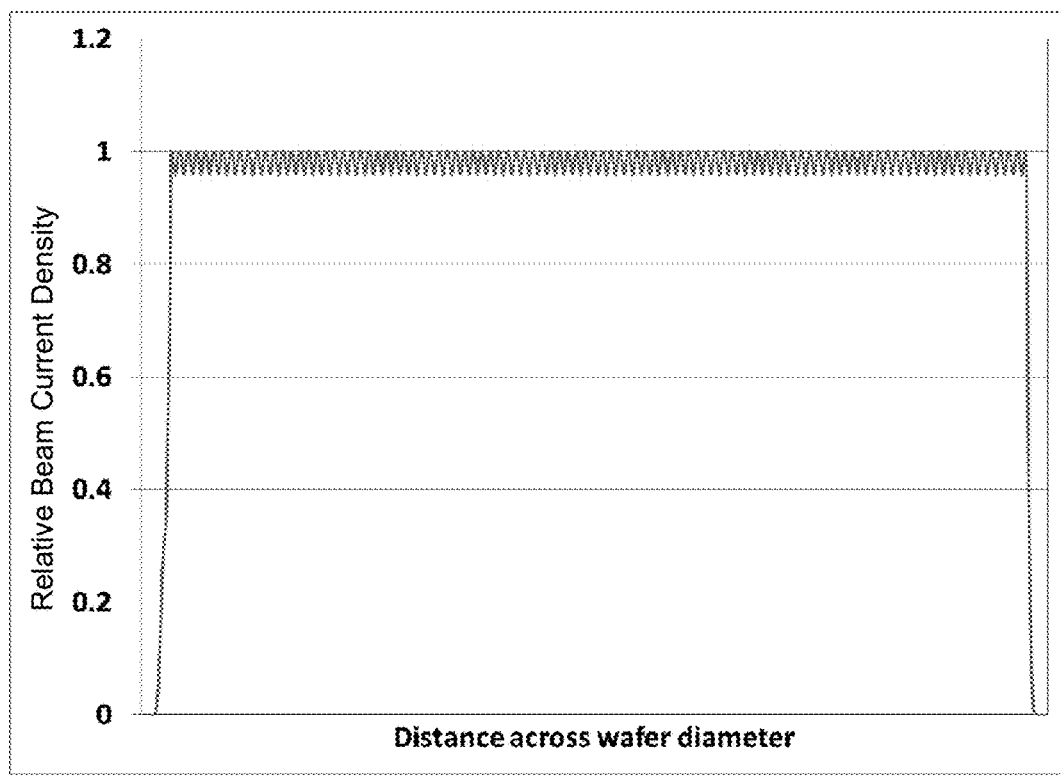
FIG. 6 illustrates the relative beam current density vs. distance across the substrate diameter where a static divergent beam is used with a static substrate.

FIG. 6 illustrates a graph showing the relative beam current density vs. distance across the substrate diameter for an embodiment where the ion beams are divergent. Due to the ion intensity peaks from each of the individual ion beams, the beam current density is not uniform across the substrate. Instead, there is a clear periodic variation in ion intensity across the substrate. Thus, while divergent beams can help promote more uniform ion coverage over the surface of a wafer compared to where focused beams are used, there is still reason to move the substrate and ion beams relative to one another. This movement will help promote more uniform ion delivery by spatially averaging the ion distribution over the substrate surface, thereby minimizing the effect of non-uniform ion delivery within each ion beam.

One method for moving the substrate and ion beams relative to one another is to rotate the substrate. However, for the reasons discussed above, substrate rotation may be avoided in various embodiments herein. Another method is to translate the substrate. A mechanical motor, robot, or other mechanism may be provided to move a wafer in a non-rotational manner. The mechanism may translate the substrate in a direction that results in the ion beams impinging upon different portions of the substrate (i.e., in a direction that is not parallel to the of the ion beam). As used herein, the direction of an ion beam is considered to be the direction along the centerline of the ion beam. This is the case whether the ion beams are collimated or divergent. Alternatively or in addition, the ion beams themselves may be moved over the surface of the substrate. As noted above, various techniques may be used to move the ion beams.

B. Electrostatic Techniques

Certain techniques disclosed herein involve the use of an ion extractor/source having an electrode with apertures that are off-center compared to apertures in the other electrodes of the ion source. The off-center aperture electrode may be used to control the angle at which the ion beams leave the ion extractor/source. The off-center aperture electrode may be referred to herein as an off-center (OC) electrode.

The angle of the ion trajectories is measured based on the centerlines of the ion beams and the surface of the lowermost electrode in the ion extractor/source. The lowermost electrode is the electrode in the ion extractor that is positioned closest to the substrate (and between the plasma generation region and the substrate). In other words, ion beams that travel straight through the apertures in the electrodes of the ion extractor, without being deflected, are directed at approximately a normal angle with respect to the ion extractor and ion source. By contrast, ion beams that are deflected (whether through electrostatic techniques, mechanical techniques, magnetic techniques, a combination thereof, etc.) are directed in a non-normal angle with respect to the ion extractor and ion source (since the ion trajectories, either immediately upon leaving the lowermost electrode of the ion source or at some point afterward, point away from the lowermost electrode at a non-90° angle).

Figure 7A:
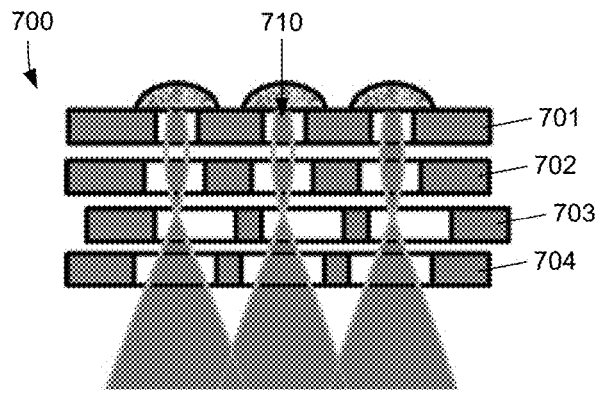
FIGS. 7A and 7B illustrate embodiments of an ion extractor that includes an off-center aperture electrode.
Figure 7B:
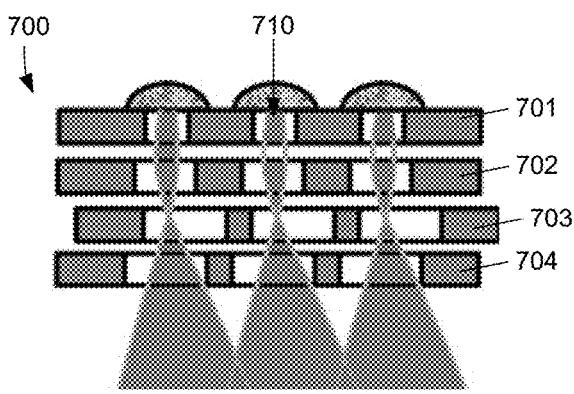

FIGS. 7A and 7B present simplified cross-sectional views of an ion extractor 700 including four electrodes 701, 702, 703, and 704. Electrode 703 is an OC electrode, since the apertures 710 in electrode 703 are off-center compared to the apertures 710 in the other electrodes. In FIG. 7A, no bias potential is applied to the OC electrode 703, and the ion beams travel vertically through the apertures 710 in a direction that is normal to the electrodes. In FIG. 7B, however, a bias potential is applied to the OC electrode 703 to cause the ion beams to bend. As such, the ion beams leave the electrodes in a direction that is non-normal to the electrodes. The ion beams may be parallel to one another (i.e., the centerlines of the ion beams may be parallel). In FIG. 7B, the ion beams are skewed to the right when the bias potential is applied to OC electrode 703.

Figure 8:
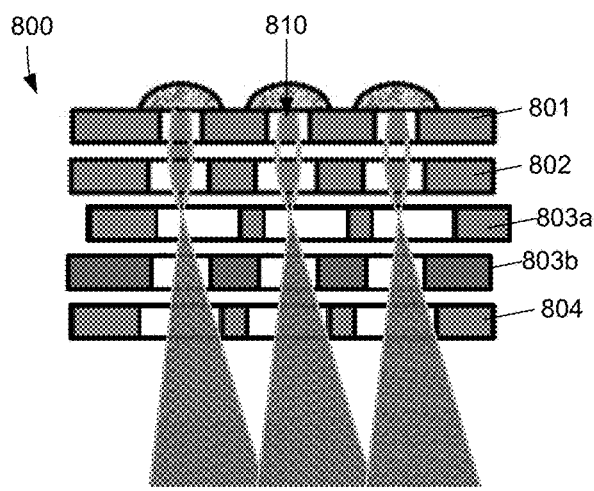
FIG. 8 presents an embodiment of an ion extractor that includes two off-center aperture electrodes.

The OC electrode need not be positioned relative to the other electrodes as shown in FIGS. 7A and 7B. In certain embodiments the relative placement of the electrodes is different than what is shown in these figures. Whatever their relative positions, the OC electrode and other electrodes should be configured (e.g., shaped, positioned, and biased as appropriate) such that when the ion beams are bent, the ion beams are still able to travel through the apertures in other (e.g., lower positioned) electrodes. In certain embodiments, for example as shown in FIG. 8, more than one OC electrode is used. Here, the ion extractor 800 includes two OC electrodes 803a and 803b. Electrodes 801, 802, and 804 are also shown. The first OC electrode 803a has apertures 810 that are offset in a first direction (e.g., the x-direction, left/right in FIG. 8) from apertures 810 in electrodes 801, 802, and 804. The second OC electrode 803b has apertures 810 that are offset in a second direction (e.g., the y-direction, into/out of the page in FIG. 8) from apertures 801 in electrodes 801, 802, and 804. Thus, the two OC electrodes 803a and 803b can be used together to move the ion beams around the substrate surface in both x- and y-directions. The apertures 810 in the second OC electrode 803b are shown as smaller than apertures 810 in electrodes 803a and 804 in the particular cross-section shown. However, the apertures 810 in the second OC electrode 803b may be the same size or larger than these other apertures 810 in other electrodes. Because the apertures 810 in the second OC electrode 803b are offset in the y-direction (e.g., the aperture centers are in the plane of the page for electrodes 801, 802, 803a, and 804, while the aperture centers for the second OC electrode are behind the plane of the page), the full diameter of these apertures is not shown.

In certain cases, the apertures in the OC electrode may be the same size as apertures in other electrodes, or the apertures may be smaller or larger than apertures in other electrodes. In one particular implementation, lower positioned electrodes may have larger diameter apertures than higher positioned electrodes. When viewed from above, the centers of apertures in the OC electrode may be offset from the centers of apertures in other electrodes by a distance of about 25% or less of the diameter of the apertures in the OC electrode, for example about 15% or less.

In various implementations, all or substantially all of the apertures in an OC electrode are each offset in the same direction and to the same degree compared to apertures in the other electrodes. Where more than one OC electrode is provided, the apertures in each OC electrode may be offset by the same or different degrees compared to one another. Often, the apertures in each OC electrode are offset in different directions (e.g., apertures in a first OC electrode being offset in a different direction than apertures in the second OC electrode, as in FIG. 8).

In certain embodiments, the angle at which the ion beams leave the ion extractor/source is varied (and the ion beams therefore move over the substrate surface) by varying the voltage applied to the off-center aperture electrode. When no voltage is applied to the off-center aperture electrode, the ion beams travel substantially straight through the apertures, and the ion beams leave the ion source at a normal angle. In contrast, when a voltage is applied to the off-center aperture electrode, the ion beams are directed away from the ion source at a non-normal angle. This non-normal angle depends upon the voltage applied to the off-center aperture electrode. Therefore, the ion beams can be moved around the surface of the substrate by varying the voltage applied to the off-center aperture electrode.

In certain implementations, the voltage applied to the off-center aperture electrode sweeps between and accelerating potential to a retarding potential. The applied voltage is swept between a maximum about 10× the beam voltage (accelerating the beam) to a minimum (in the opposite polarity) of about 95% of the beam voltage (retarding the beam), for example between about 2× acceleration of the beam voltage to 50% deceleration of the beam voltage, with respect to the immediately surrounding electrodes, or for example between 1.5× acceleration of the beam voltage to 25% deceleration of the beam voltage.

Figure 9:
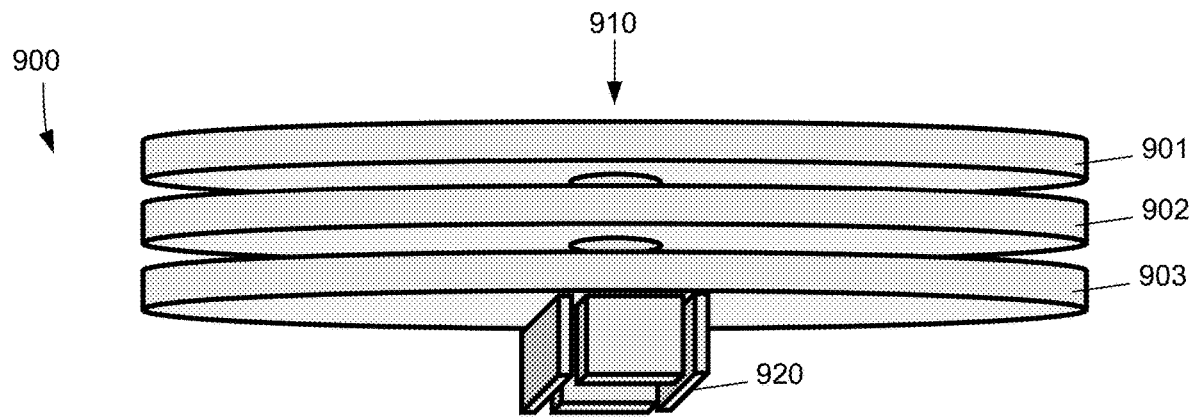
FIG. 9 depicts an ion extractor including a set of deflection plates.

Another electrostatic technique for moving the ion beams over the surface of the substrate involves providing deflection plates (e.g., MEMS devices) under one of the electrodes, as shown in FIG. 9. In FIG. 9, only a single aperture 910 and set of deflection plates 920 is shown for the sake of clarity. However, it should be understood that the electrodes often have an array of apertures, with sets of deflection plates provided for each aperture on the relevant electrode. Further, FIG. 9 shows three electrodes 901, 902, and 903, though additional or fewer electrodes may be provided in various embodiments. The deflection plates 920 are provided below an electrode 903 on opposite sides of each aperture 910. The deflection plates 920 are not limited to being positioned below the lowermost electrode. By applying appropriate electrostatic potentials, an electric field is generated between each set of deflection plates. This electric field can bend the trajectory of the ion beams as they pass through. Thus, where such deflection plates are provided, the off-center aperture electrode may be omitted. By varying the electric field between set of deflection plates, the trajectory of the ion beams can be controlled such that the ion beams move over the surface of the substrate during etching. In other words, the directions of the ion beams exiting the ion extractor/source can be modified over the course of etching. The sets of deflection plates may be individually/independently addressable/controllable, or they may be accessed/controlled together.

In certain embodiments, the deflection plates are provided below the lowermost electrode in the ion source. In other embodiments, the deflection plates may be provided below a different electrode, for example below the second electrode, or below the third electrode (when counting from the bottom electrode upwards). The electrodes, apertures, and deflection plates should be configured such that a significant portion of the ion beams travel through the apertures in the electrodes, even when the trajectory of the ion beams is skewed. This factor makes placement of the deflection plates below the lowermost electrode particularly effective (since there are no further electrodes to block the skewed ion beams), though those of ordinary skill would understand that other arrangements are possible and are within the scope of the present embodiments.

Figure 21:
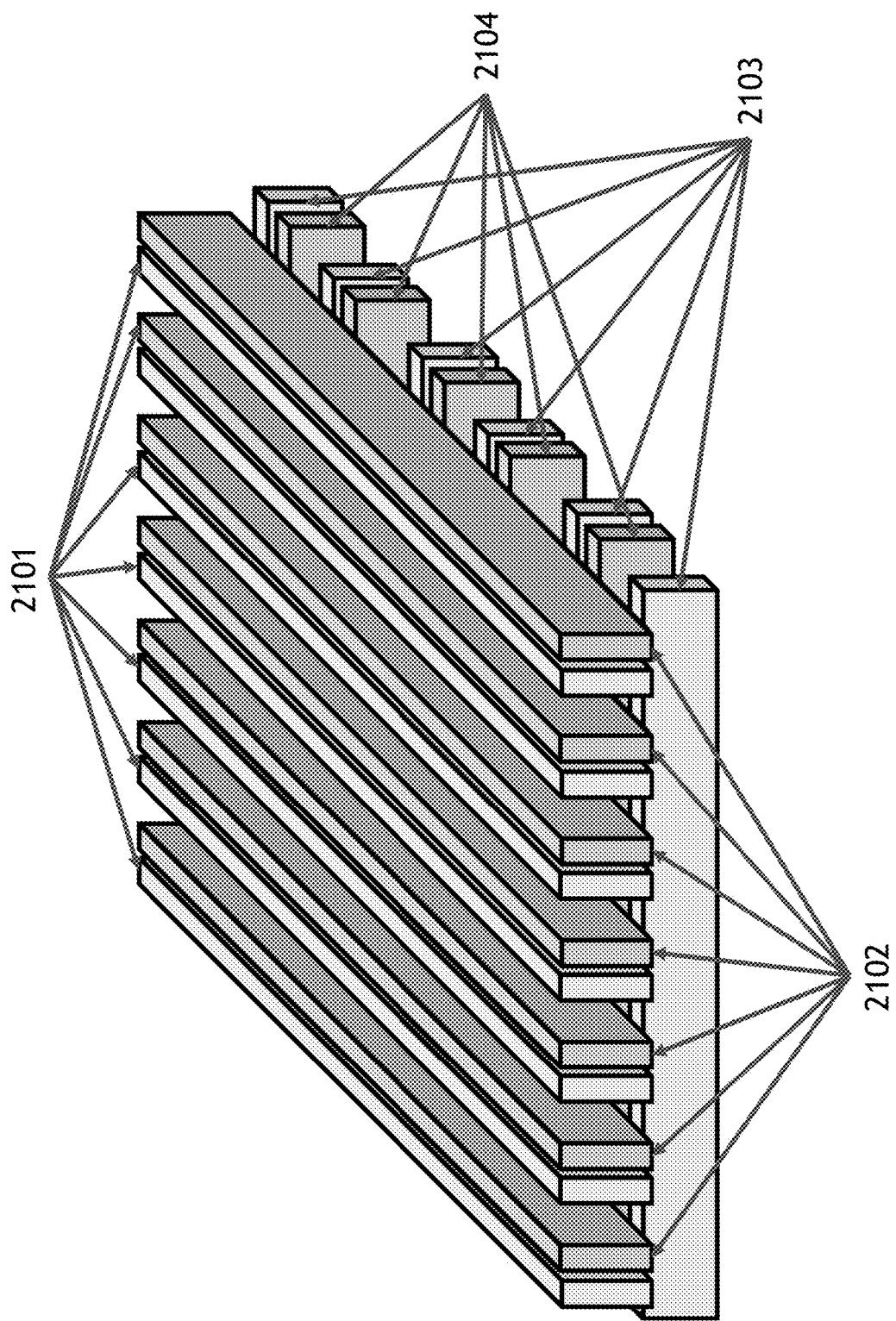
FIG. 21 illustrates deflection plates used to deflect ion beams according to certain embodiments.
Figure 22:
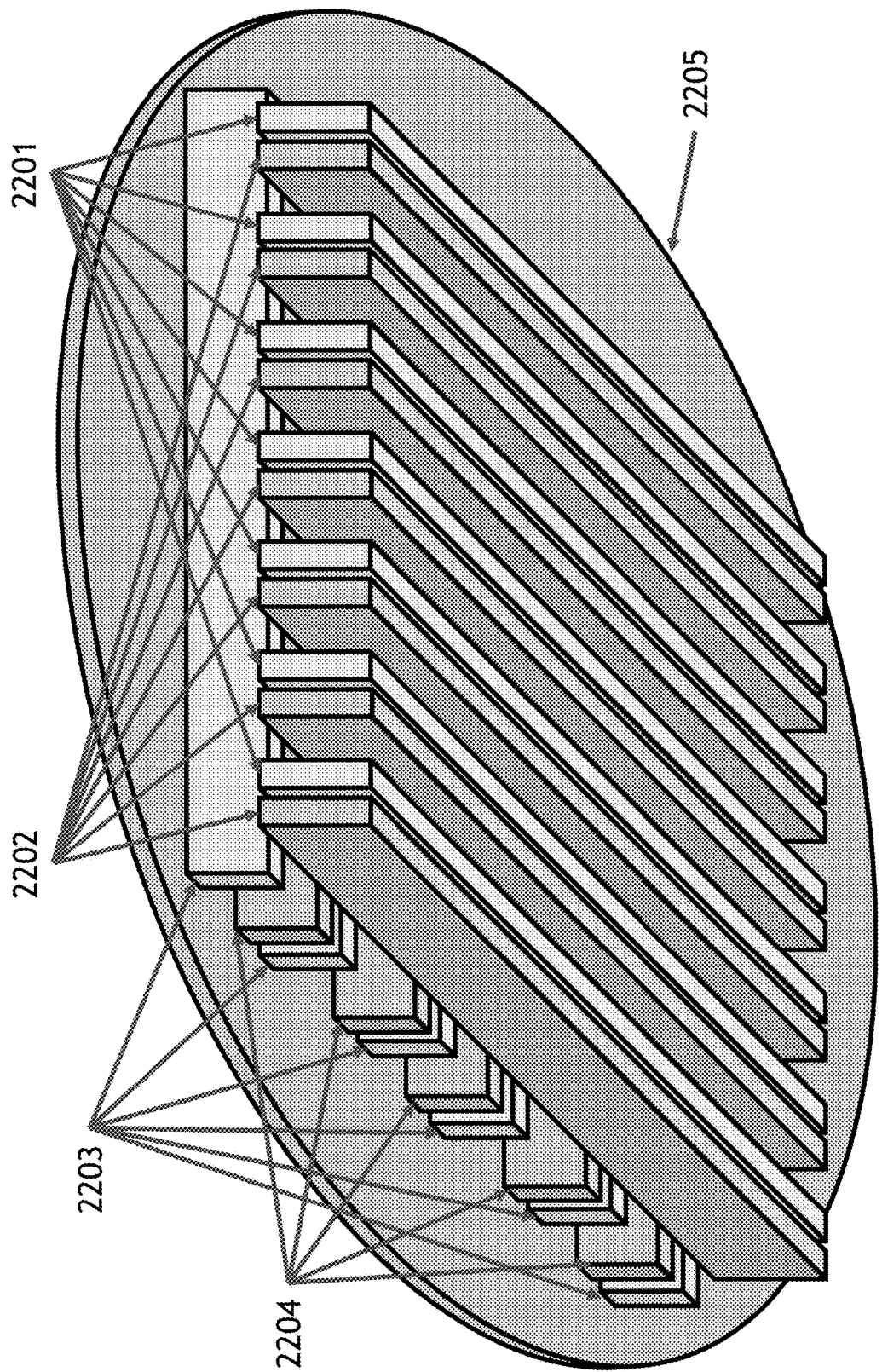
FIG. 22 depicts the deflection plates of FIG. 21 attached to an electrode.

Structures for creating the beam deflecting electric fields can be fabricated/configured in several ways. One such approach uses arrays of stacked metal or semiconductor bars as shown in FIG. 21. These bars (2101, 2102, 2103, and 2104) are connected to and separated by an insulator (not shown for clarity). Bars 2101 and 2102 are used deflect the beam in say the x-direction, while bars 2103 and 2104 would be used to deflect in say the y-direction. In general, each bar could be set to different voltages. In various embodiments, all bars 2101 may be set to the same potential, while bars 2102 may be set to the same magnitude but opposite polarity of the bars 2101. Similarly, bars 2104 may be set to the same magnitude and opposite polarity of bars 2103. Other relative (e.g., unequal) magnitudes of potential may also be used. In some implementations, bars 2102 and 2104 may be grounded, and deflection is achieved by only applying a potential to bars 2101 and 2103. As an example, for bars 1 cm tall, and separated by 1 cm, +50V potential applied to bars 2101 and −50V potential applied to bars 2102, would deflect a 100 eV Argon ion about 26 degrees. These arrays of deflection bars (2201, 2201, 2203, and 2204) may be mounted on or in proximity to one of the electrode plates 2205 as shown in FIG. 22.

Figure 23:
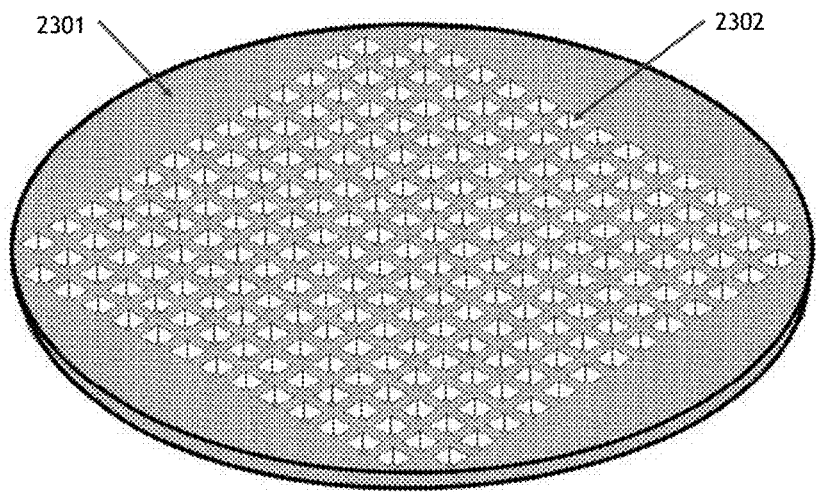
FIG. 23 shows an insulating plate with holes therein, the holes including deflection plates to deflect ion beams traveling through the holes.
Figure 24:
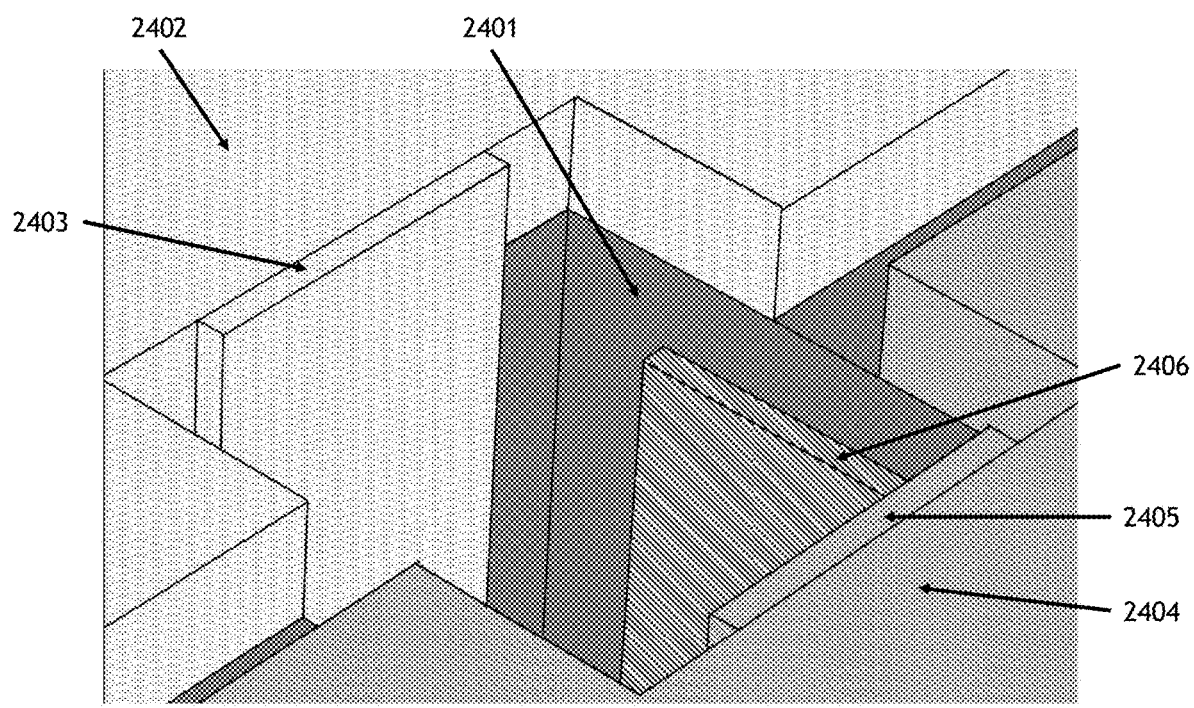
FIG. 24 depicts a close-up view of the holes shown in FIG. 23.

Alternatively, micromechanical manufacturing techniques could be used to fabricate deflection plates onto an insulating plate such as quartz or alumina or other insulating material. An example is shown in FIGS. 23 and 24. FIG. 23 represents an insulating material 2301 that has an array of square holes 2302 machined or micro-machined therein. These holes 2302 may be spaced to coincide with the hole arrays used in the ion source extraction/focusing electrodes. After forming the array of holes 2302, conducting materials (e.g., metals or semiconductors) can be deposited on to the surfaces and inside the holes 2302 of the insulating plate 2401 and patterned to form deflection electrodes. One such representative hole is shown in FIG. 24. The deposited conductor material (shown at 2402, 2403, 2404, 2405, and 2406) is patterned to form two pairs of deflection electrodes 2403/2405 and 2406/an electrode (not shown) opposite deflection electrode 2406. Deflection electrodes 2403 and 2405 may be energized by conductors 2402 and 2404, respectively. Deflection electrode 2406 may be powered by a conductor on the opposite side of the insulator 2401 (as represented in FIG. 24), or by an additional patterned conductor on the same side of the insulator 2401 as conductors 2402 and 2404.

C. Mechanical Techniques

Another option for moving the ion beams over the surface of the substrate relates to certain mechanical techniques. These techniques are related to some of the electrostatic techniques described above. In one embodiment, an off-center electrode as described above is biased to bend the trajectory of the ion beams. The ion beams may be moved around the substrate surface by physically moving the OC electrode. For example, in various embodiments the OC electrode may be translated within the plane of the electrode to move the ion beams over the substrate surface. Such movement may be in addition to or in lieu of modulating the bias potential applied to the OC electrode. Where mechanical techniques are used, the distance by which the OC electrode moves may be at least about 1% of the aperture diameter for example at least about 20%. In these or other cases, the distance by which the OC electrode moves may be about 50% of the aperture diameter or less, for example about 25% of the aperture diameter or less.

D. Magnetic Techniques

Magnetic techniques may also be used to cause the ion beams to move over the substrate surface. These magnetic techniques may also serve other purposes, for example directing the ion beams onto the substrate in a desired manner. In one example, one or more coils provided around the chamber provide a magnetic field near the ion extractor/source that may be used to (a) bend the trajectory of the ion beams such that the ion beams travel away from the ion source at a non-normal angle, and to optionally (b) cause the ion beams to move over the surface of the substrate during etching. In another example, one or more coils are provided around the chamber provide a magnetic field at a position between the ion source and the substrate to (a) bend the trajectory of the ion beams such that the ion beams impact the substrate in a desired region/at a desired angle of incidence, and/or to (b) cause the ion beams to move over the surface of the substrate during etching. A magnetic field applied in this region (between the ion source and the substrate) may be particularly useful for re-aiming ion beams that would otherwise either miss the substrate entirely or impact the substrate at a less desirable angle. For example, a magnetic field in this region may be used in combination with techniques that result in ion beams that leave the ion source at non-normal angles. Regardless of where a magnetic field is applied, the ion beams can be moved around the surface of the substrate by varying the strength of (at least one of) the magnetic field(s). Any magnetic field applied to the chamber may result from the combination/overlay of two or more magnetic fields.

The magnetic fields are generated through electromagnets and/or permanent magnets. These magnets are typically provided outside the main processing portion of a reaction chamber, for example around the outer periphery of the reaction chamber. Where electromagnets are used, the electromagnets may be in the form of coils. In certain cases, sets of coaxial electromagnetic coils (including solenoids) are provided. In a particular case, the coaxial electromagnetic coils may be Helmholtz coil pairs, which may be used to produce a nearly uniform magnetic field. A third coil, sometimes referred to as a Maxwell coil, may be provided between a set of Helmholtz (or other) coils to make the magnetic field even more uniform.

Figure 10:
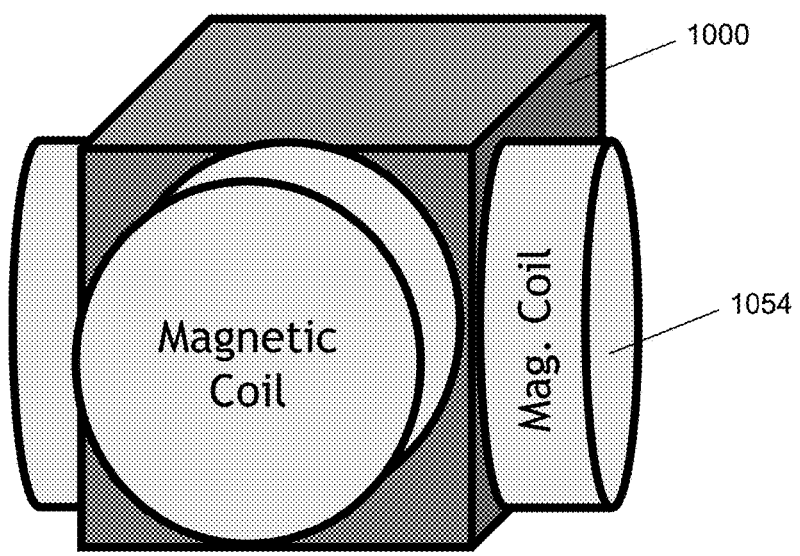
FIG. 10 shows an etching apparatus having sets of magnetic coils disposed around the perimeter of the apparatus.

FIG. 10 illustrates a portion of an etching apparatus 1000 having a set of electromagnetic coils 1054 positioned around the apparatus 1000. The coils generate a magnetic field having a specific magnitude and direction at various locations. The magnitude and direction of this field can be calculated using software calculation or modeling packages, such as MAXWELL™ available from Ansoft Corporation of Pittsburgh, Pa., using known parameters for coils (magnitudes and directions of currents in coils, number of coil turns, their positions, etc.). Applied magnetic fields of about 0.1 T or less would adequately deflect 100 eV Argon ions. More typically, magnetic fields of about 0.05 T or less, or specifically magnetic fields of about 0.03 T or less may be used for 100 eV Argon ions in various embodiments. Ions of heavier mass or higher energy would require higher magnetic fields to achieve similar deflection angles.

Figure 12:
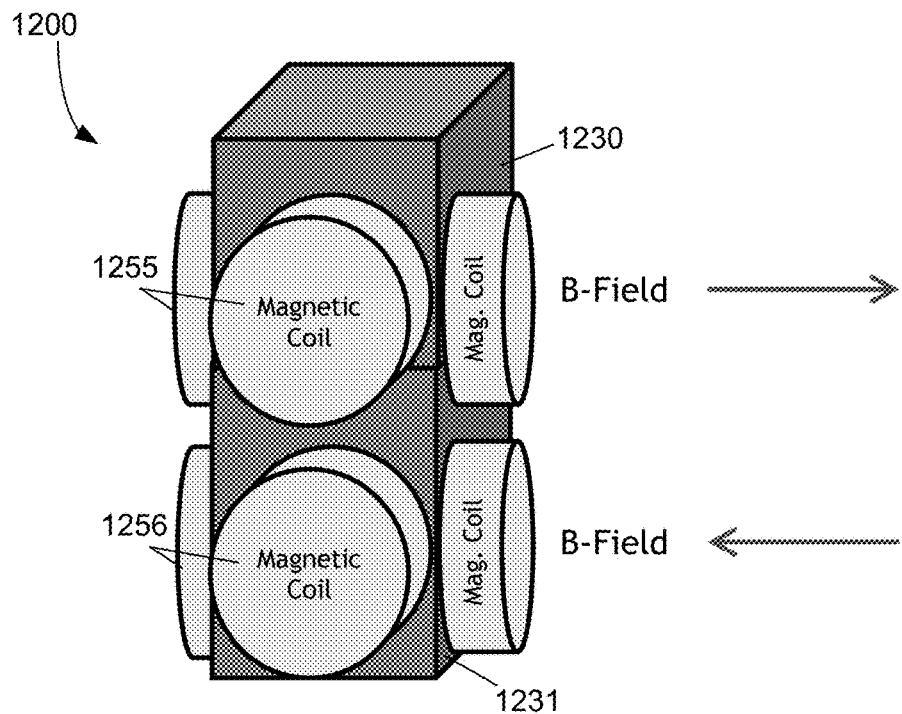
FIG. 12 depicts an etching apparatus having two different sets of magnetic coils, one positioned proximate an ion source and one positioned between the ion source and the substrate.

In certain implementations, two or more separate magnetic fields are used, for instance one magnetic field applied near the ion source and one magnetic field applied between the ion source and the substrate. The ion beams may be focused, over-focused, or under-focused. This embodiment is shown in FIG. 12. Here, etching apparatus 1200 includes an upper portion 1230 that houses an ion source (set of electrodes, not shown), and a lower portion 1231 where the substrate is positioned during etching. A first set of electromagnetic coils 1255 is positioned proximate the ion source in the upper portion 1230 of the apparatus 1200, and a second set of electromagnetic coils 1256 is positioned in the lower portion 1231 of the apparatus 1200, in the region between the ion source and substrate. The first set of electromagnetic coils 1255 creates a first magnetic field in a first direction, and the second set of electromagnetic coils 1256 creates a second magnetic field in a second direction. In FIG. 12, the first and second magnetic fields are in opposite directions. In a similar embodiment, the first and second magnetic fields may be in orthogonal directions (e.g., the first field oriented rightward in the plane of the page, as shown, and the second field oriented into or out of the page). Various directions and combinations of directions may be used for the different magnetic fields. One purpose of the first magnetic field produced by the first set of electromagnetic coils 1255 is to cause the ion beams to leave the ion source at a non-normal angle. One purpose of the second magnetic field produced by the second set of electromagnetic coils 1256 is to re-aim the ion beams back onto the substrate surface. An additional purpose of either or both magnetic fields is to move the ion beams around the substrate surface to average out the ion beam intensity over the surface of the substrate. Such movement can be accomplished by varying the current running through the coils, thereby altering the magnetic field and affecting the trajectory of the ion beams.

Figure 13:
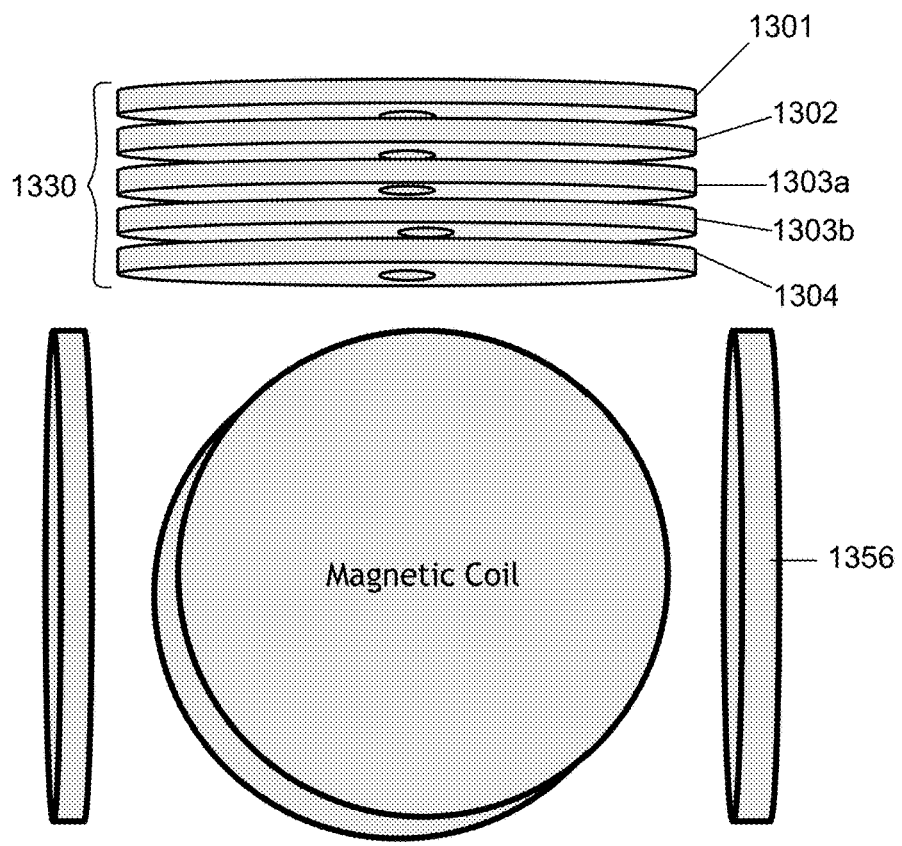
FIG. 13 illustrates an embodiment where the ions source includes two off-center aperture electrodes, and where magnetic coils are used to create a magnetic field below the ion source.
Figure 14:
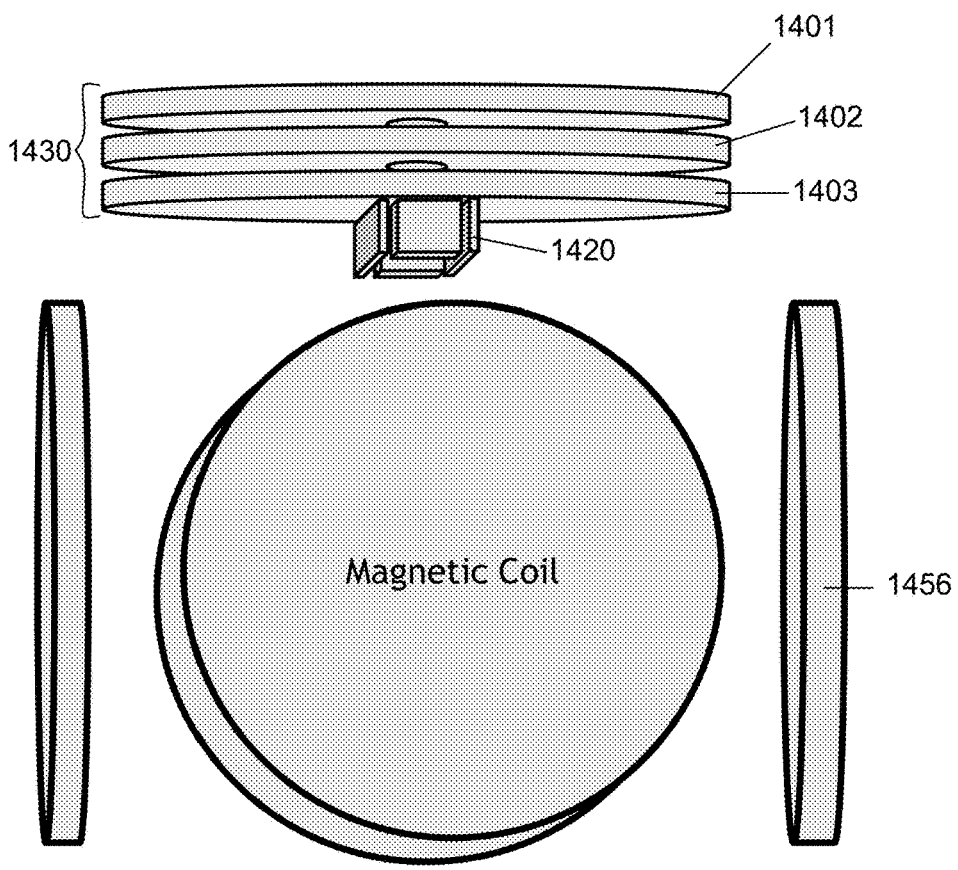
FIG. 14 illustrates an embodiment where the ion source includes deflection plates, and where magnetic coils are used to create a magnetic field below the ion source.

In another implementation, an electric field (or a series of electric fields, as described above in relation to the paired structures/devices positioned under an electrode on either side of each aperture) is used to alter the trajectory of the ion beams such that the ion beams leave the ion source at a non-normal angle, and a magnetic field is applied between the ion source and the substrate to re-aim the ion beams back onto the substrate surface. The ion beams may be focused, over-focused, or under-focused. These embodiments are shown in FIGS. 13 and 14. In these figures, only a single aperture is shown for the sake of clarity. However, it should be understood that the electrodes typically include an array of apertures. Further, FIGS. 13 and 14 do not show the walls of the reaction chamber. It should be understood that the reaction chamber generally houses the ion source/electrodes, while the electromagnetic coils are typically provided outside the walls of the reaction chamber.

In FIG. 13, the ion source 1330 includes five electrodes, 1301, 1302, 1303a, 1303b, and 1304. Electrodes 1303a and 1303b are off-center aperture electrodes as described above. In particular, electrode 1303a has apertures that are offset in a first direction, and electrode 1303b has apertures that are offset in a second direction, similar to the embodiment shown in FIG. 8. A bias potential can be applied to either or both of the OC electrodes 1303a and 1303b to cause the ion beams to leave the ion source 1330 at a non-normal angle. The bias potential on either or both of the OC electrodes 1303a and 1303b can be varied to cause the ion beams to move over the surface of the substrate. Similarly, as mentioned above, either or both OC electrodes 1303a and 1303b can be mechanically moved to cause the ion beams to move over the substrate surface. After the ion beams leave the ion source 1330 at a non-normal angle, a magnetic field generated through electromagnetic coils 1356 is used to alter the trajectory of the ion beams. This magnetic field re-aims the ion beams back onto the substrate at a desired angle of incidence.

In FIG. 14, the ion source 1430 includes three electrodes, 1401, 1402, and 1403. Below electrode 1403 is positioned a set of deflection plates 1420, as described in relation to FIG. 9, above. The deflection plates 1420 are used to create an electric field that causes the ion beams to leave the ion source 1430 at a non-normal angle. The sets of electromagnetic coils 1456 can be used to create a magnetic field that acts on the ion beams after they leave the ion source 1430. This magnetic field can bend the trajectory of the ion beams such that the ion beams are re-aimed back onto the substrate at a desired angle of incidence.

Figure 15:
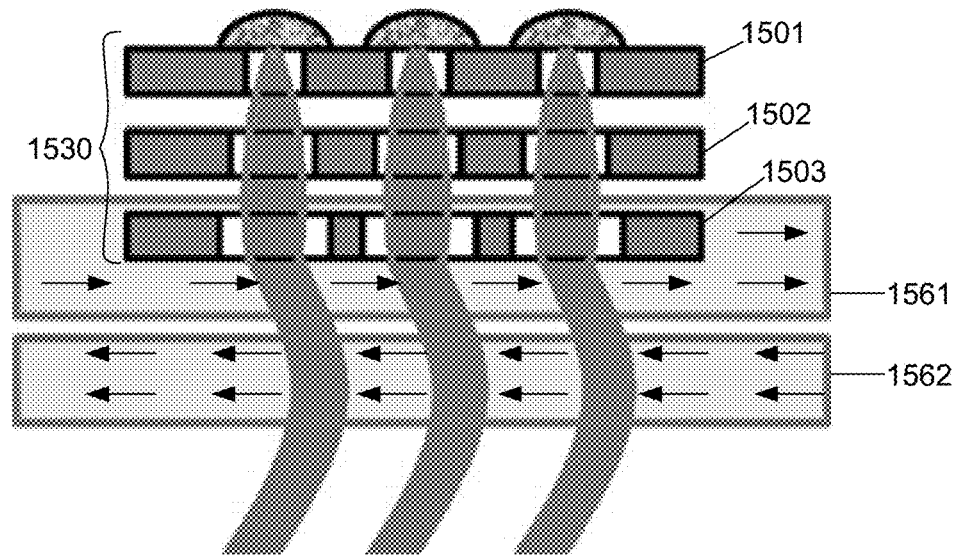
FIG. 15 generally depicts various embodiments in which electric and/or magnetic fields are used to alter the trajectory of ion beams.

FIG. 15 broadly illustrates an implementation of the embodiments shown in FIGS. 12 and 14. Various details are omitted. The ion beams in the embodiment of FIG. 15 are focused/collimated. As mentioned above, these embodiments may also be practiced with divergent (i.e., over- or under-focused) ion beams. Here, the ion source 1530 includes three electrodes 1501, 1502, and 1503. A first field 1561 is generated to deflect the ion beams toward the right, and a second field 1562 is generated to deflect the ion beams toward the left. The arrows in the fields 1561 and 1562 are intended to show the direction of force on the ion beam from the applied field. The first field 1561 may be an electric field (as in FIG. 14) or a magnetic field (as in FIG. 12). The second field 1562 may be a magnetic field. Similarly, where the embodiment of FIG. 13 is practiced, the ion beams may be correspondingly diverted and re-diverted, though in that case the ion source will include at least one OC electrode.

The different options for directing ion beams as described herein can be used in various combinations. Further, the different options can be used with both divergent and non-divergent ion beams. These options are not limited to any particular implementation of the etching apparatus, and various modifications may be made. Such modifications may include different numbers of electrodes, different relative orientation of the electrodes, different relative orientation of applied fields, etc. Moreover, any of the embodiments herein can be practiced with particular apparatus features including, for example, a hollow cathode emitter electrode and/or an injection head for providing reactants at local high pressure, as described further below.

E. Hollow Cathode Emitter Electrode

Any of the embodiments herein may be modified to include an additional electrode, which may be a hollow cathode emitter electrode. In certain embodiments, the hollow cathode emitter electrode is provided above the extraction electrode to create numerous high density ion sources above the extraction electrode. In effect, each aperture in the hollow cathode emitter electrode acts as hollow cathode emitter, thereby providing numerous local high density ion sources. In other embodiments the hollow-cathode emitters may be incorporated within the extraction electrode itself. The apertures in the hollow cathode emitter electrode are designed or configured to be aligned with the apertures in the other electrodes. The hollow cathode emitter electrode therefore increases the efficiency of active ion generation, as a substantial majority of the ions generated in the hollow cathode emitters are successfully transferred through the electrodes to the wafer. This allows for high density ion generation at lower energy levels.

Hollow cathodes typically include a conductive tube/cylinder having an emitter material on the inside surface. In the context of a hollow cathode emitter electrode, the conductive tubes/cylinders are the apertures. The emitter material preferably has a low work function, which allows the material to have a high secondary electron yield. Example emitter materials include, but are not limited to, silicon, tungsten, molybdenum, rhenium, osmium, tantalum, aluminum, titanium, and thoriated tungsten. The emitter may also be coated with a material to enhance secondary electron yield, or prevent corrosion to sputtering. This coating may be vapor deposited, sprayed on, electroplated, electro-less plated, chemical vapor deposited, plasma enhanced chemically vapor deposited, painted on, spun on, etc. Additionally the electrode material may be anodized. Typically, the electrode contains only a single material; in other words, the emitter material is the electrode material. The overall shape (e.g., thickness, diameter) of the hollow cathode emitter electrode may be substantially the same as the shape of the other electrodes.

During etching, gas and/or plasma may be fed/generated upstream of the hollow cathode emitter electrode. Where plasma is generated upstream from the hollow cathode emitter electrode, such plasma may be an inductively coupled plasma, a capacitively coupled plasma, a transformer coupled plasma, a microwave plasma, etc. The plasma may be generated remotely or in the reaction chamber above the hollow cathode emitter electrode. The hollow cathode emitter electrode may be RF biased, for example between about 50-5,000 W, assuming a single 300 mm substrate is present. Emitted electrons ionize the gas in each aperture as the gas travels through hollow cathode emitter electrode. The ionization mechanism is discussed further below with respect to FIG. 17.

In certain embodiments, apertures of the hollow cathode emitter electrode are configured to have a shape that promotes high density ion formation. One example shape that achieves this purpose is a frustoconical aperture. Other shapes such as inverted cones, domes, inverted pyramids, etc. may also be used to promote ion formation. Generally, aperture shapes that are wider on the top compared to the bottom are especially useful.

In certain embodiments, it is desirable to have a gas pressure that is higher upstream of the hollow cathode emitter than downstream. To enable a pressure drop across the emitter, the gas conductance through the emitter holes should be low. In some cases the gas conductance through the electrode stack may be below about 10,000 L/min. For example the gas conductance may be between about 50-1000 L/min. For example, about a 1 Torr pressure differential (above vs. below the hollow cathode emitter) can be achieved by narrowing the minimum diameter (dimension $d_2$ in FIG. 8) of the aperture. For example, an array of 1000 apertures, with a $d_2$ diameter of 0.5 mm, and $d_3$ length 1 mm would have a gas conductance of about 800 L/min and would experience about a 1 Torr pressure drop when gas was flowing at about 1 SLM flow rate.

In embodiments where the gas conductance through the electrode assembly is reduced, a gas by-pass pathway may be used. This gas by-pass pathway would be opened to prevent excessive pressure differential across the electrode assembly, for example during initial pump down of the entire assembly. This gas by-pass then could be closed during operation if a pressure differential is desired.

Figure 16:
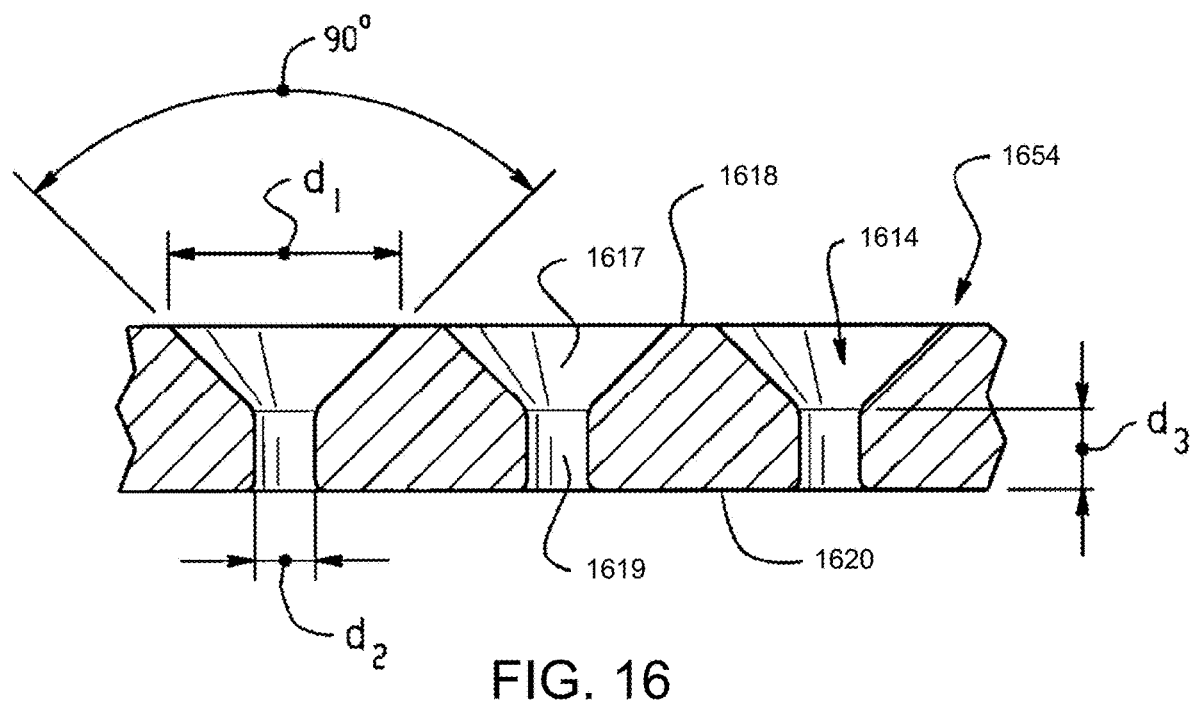
FIG. 16 shows a hollow cathode emitter electrode according to certain embodiments.

FIG. 16 presents a close-up cross-sectional view of a hollow cathode emitter electrode 1654 having frustoconically shaped apertures 1614. Each aperture 1614 has a first diameter $d_1$ on an upper surface 1618 of hollow cathode emitter electrode 1654 and a second diameter $d_2$ on a lower surface 1620 (or wafer side) of hollow cathode emitter electrode 1654. The first diameter $d_1$ is larger than the second diameter $d_2$. In some cases, the first diameter $d_1$ is between about 1 mm-20 cm. The second diameter $d_2$ may be between about 0.1 mm-10 cm. The ratio of the first diameter to the second diameter ($d_1/d_2$) may be between about 1.2-10. As can be seen, the upper sides of the apertures 1614 are generally frustoconical in shape, being tapered inward by a 90° chamfer until the interior diameter thereof is equal to $d_z$. The chamfer angle is measured as shown in FIG. 16. In other embodiments the conical section has a different chamfer angle, for example between about 45-120°. The frustoconical section meets the cylindrical section roughly halfway through the thickness of the hollow cathode emitter electrode 1654, and thus apertures 1614 may be characterized as having both a frustoconical section 1617 and a cylindrical section 1619. The cylindrical section 1619 of aperture 1614 has a height represented by $d_3$ in FIG. 16. In some cases, the height of the cylindrical section 1619 is between about 0.2 mm-2 cm. In these or other cases, the height of the frustoconical section 1617 is between about 0.5 mm-2 cm. The aperture diameters and heights herein, while shown in the context of an aperture having a frustoconical section and a cylindrical section, may also apply to apertures of different but similar shapes.

Figure 17:
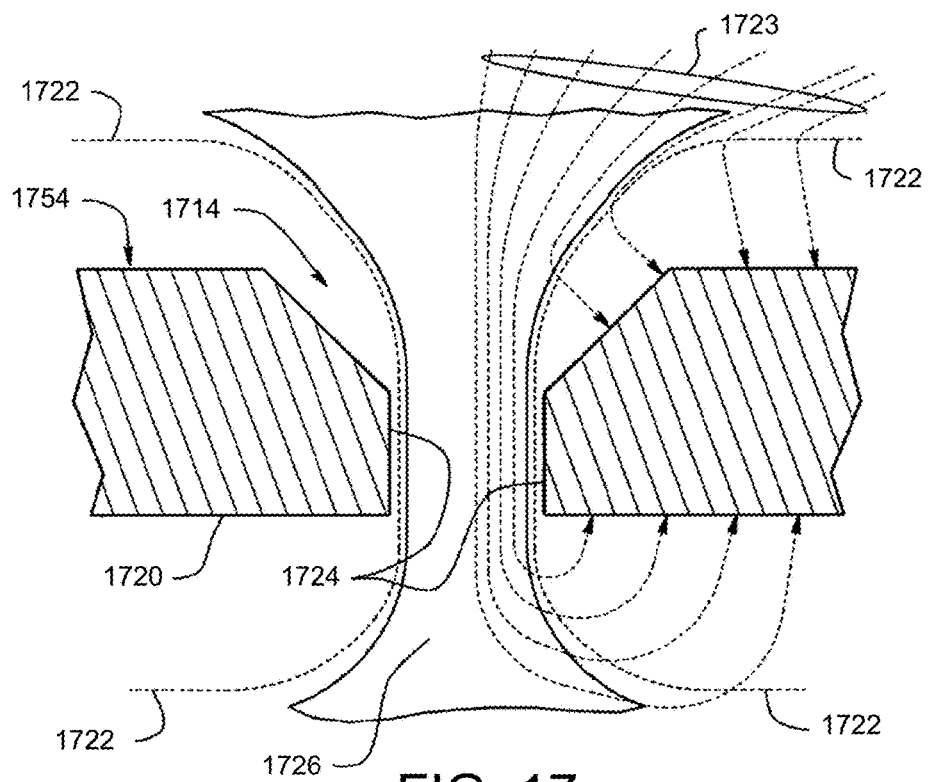
FIG. 17 shows a close-up view of a hollow cathode emitter electrode according to certain embodiments.

FIG. 17 illustrates the micro-jet, low-energy ion generation region through the chamfered apertures 1714 of the hollow cathode emitter electrode 1754. As a result of the primary plasma discharge above the hollow cathode emitter electrode 1754, a local sheath 1722 is created in the apertures 1714, thereby resulting in an electric field. The primary plasma discharge may be from any appropriate plasma source upstream of the hollow cathode emitter electrode 1754. Example plasma sources include inductively coupled plasma sources, capacitively coupled plasma sources, microwave plasma sources, remote plasma sources, etc.

The electrons and ions from the primary discharge enter the apertures 1714 and create a current path (indicated by dashed arrows 1723) through each aperture and to the lower surface 1720 of the hollow cathode emitter electrode 1754. As the current lines (arrows 1723) converge approaching the apertures 1714, the current density increases, causing the formation of a denser plasma in the aperture, thereby forming the plasma jet which has a narrow plasma sheath. The increased plasma density of the microjet may also increase the neutral temperature which reduces the density of neutrals in the apertures. The combination of these effects may increase the electron temperature and change the chemistry of the discharge in the micro-jet. In addition, the ions are also accelerated by the sheath and strike the inner surface 1724 of the apertures 1714, thereby ejecting secondary electrons. The narrower sheaths associated with high plasma density plasma permit the acceleration of the electrons across the sheath 1722 with few collisions resulting in the creation of very energetic electrons in the micro-jet. The secondary electrons gain enough energy so as to collide with neutral gas molecules, thereby ionizing them and creating a micro-jet shaped discharge 1726 through the apertures.

In some cases, the primary plasma discharge may be omitted. In other words, the hollow cathode emitter electrode may be the sole source of plasma/ions. In these embodiments, the initial high energy electrons that begin the cascade for ion formation are generated as a result of an RF bias applied to the hollow cathode emitter electrode. High voltage gradients and/or long apertures help promote formation of the micro-jets. These considerations are less important where high energy electrons are also being provided from a primary plasma upstream of the hollow cathode emitter electrode. Where no separate plasma source is included beyond the hollow cathode emitter electrode, the RF bias on the hollow cathode emitter electrode may be between about 500-10,000 W. Where a separate plasma source is included, the bias may be less extensive.

The micro-jet discharge 1726 is the primary source of ions that ultimately impinge on the wafer. In addition, it has also been empirically determined that a low aspect ratio (diameter $d_2$ divided by height $d_3$) of the apertures 1714 enhances the micro-jet discharge. However, if the height of the apertures 1714 (i.e., thickness of the hollow cathode emitter electrode 1754) is made too small, the capacity for cooling of the electrode is eliminated. On the other hand, if the diameter of an aperture is made too large so as to lower the aspect ratio, the effectiveness of the hollow cathode emitter electrode in uniformly dispersing the plasma discharge is diminished. Accordingly, the apertures 1714 of the present embodiments may be configured so as to provide a lower aspect ratio for effective generation and transport of an ion rich plasma, through the apertures to the wafer, while still allowing effective electrode cooling.

The sizing and aspect ratio of the apertures 1714 needed to generate reliable micro-jets therein is a function of the process conditions, including parameters such as plasma power, pressure, gas composition, etc. In this process, the "lighting" of micro-jets in the apertures 1714 is required to achieve uniform processing. The process described achieves the uniform and reliable lighting of the micro-jets to produce such uniform processing. This differs from other applications, such as grids, in which a perforated plate used for shielding or generating/modulating electric or electro-magnetic fields has holes that do not reliably form micro-jet discharges. Similarly, the present invention embodiments differ from other prior art where a perforated plate with holes is used as an electron or ion lens in which the plasma passes through the apertures in the plate without the formation of a micro-jet discharge.

The use of a hollow cathode emitter electrode allows for high density ion extraction using relatively lower voltages/extraction fields. This may help reduce on-wafer damage from high energy ions. Where a hollow cathode emitter is used, it may be RF biased between about 100-10,000 W. In such cases, the extraction electrode may be biased between about 20-10,000 V with respect to the lower electrode, the focus electrode may be biased at an intermediate potential between the extraction electrode and the lower electrode, or a potential higher than the extraction electrode. The lower electrode may be grounded or biased relative to the level of the wafer, for example between about 0-negative 1,000 V relative to the substrate. A potential gradient between the extraction/focus/lower electrodes as installed may be between about 0-5,000 V/cm.

The use of a hollow cathode emitter electrode in the context of ion beam etching is further discussed in U.S. patent application Ser. No. 14/473,863, incorporated by reference above.

F. Injection Head

Any of the embodiments herein may be practiced in combination with an injection head as described herein. The injection head is useful for ion beam etching processes where a reactant gas is delivered to the substrate. Ion beam etching processes are typically run at low pressures. In some embodiments, the pressure may be about 100 mTorr or less, for example about 10 mTorr or less, or about 1 mTorr or less, and in many cases about 0.1 mTorr or less. The low pressure helps minimize undesirable collisions between ions and any gaseous species present in the substrate processing region.

Unfortunately, the low pressure used in many reactive ion beam etching applications limits the rate at which reactants can be delivered to the substrate processing region. If reactants are delivered at a rate that is too high, the pressure will rise and ion-gas collisions become problematic. The low reactant flow rate results in a relatively low throughput process, because the chemical reactant/etchant is not present at a sufficient partial pressure to effectively etch the surface in a rapid manner.

Certain embodiments disclosed herein address this collision-throughput tradeoff by providing reactant gases to the surface of the substrate at a relatively high local pressure with an injection head while maintaining a relatively low pressure outside the injection head. In operation, the injection head may provide a large pressure gradient between a reactant delivery region of the injection head and the edge of the injection head. The injection head delivers reactants and simultaneously vacuums away the excess reactant species and byproducts. This setup prevents most of the reactant gas load from entering the region where such reactants are likely to collide with ions, and therefore enables both lower pressure in the overall substrate processing region and higher pressure local reactant delivery.

The injection head may be scanned over different parts of the wafer in such a manner to uniformly deliver reactant gas to the substrate surface over time. Although at any given time the scanned injection head is only supplying reactants at high pressures to a local portion of the wafer, the injection head scans over the surface of the substrate during the etching process such that, on average, the reactant gas is delivered in a uniform manner. Such scanning may be simpler and/or more uniform where the substrate does not rotate or tilt during etching, making various present embodiments particularly attractive for the use of a scanning injection head. In cases where the substrate does not tilt during etching, the mechanisms for moving the injection head do not need to accommodate such tilting. Similarly, in cases where the substrate does not rotate during etching, it is relatively simpler to design a scanning pattern for moving the injection head over the substrate to achieve uniform reactant delivery. Various scanning patterns may be used to provide uniform reactant delivery. Alternatively, the injector head may cover the entire substrate, and may be alternately positioned over the substrate, then removed from the substrate.

In one example where an injection head is used, the injection head delivers reactant gases or vapors at relatively high local partial pressures (e.g., a partial pressure that is at least about 10×, or at least about 100×, or at least about 500×, or at least about 1000×, or at least about 2000×, and in some cases at least about 3000× the pressure in the substrate processing region, outside the reactant delivery region of the injection head) while ions are actively impacting the substrate surface.

For applications such as atomic layer etching (ALE), the injection head may be particularly useful, as it allows each portion of the etching process to be pressure optimized. ALE involves sequential delivery and adsorption of reactants, purging of excess reactants, and exposure to an energy source to remove very thin layers (e.g., monolayers in some cases) of material. Often, such adsorption, purging and energy exposure operations are performed in a cyclic manner to etch material on a layer-by-layer basis. The injection head and methods of use substantially open the available operating window for the pressure at which various gases are provided. Further, the disclosed techniques may result in ALE methods that use different timing sequences. For instance, reactant delivery, purging, and exposure to energy may all occur simultaneously on different portions of the wafer. Reactant delivery and purging occur locally under the injection head, and exposure to energy (ions) occurs globally everywhere that the injection head doesn't block. Atomic layer etching methods are further discussed in the following U.S. patents, each of which is herein incorporated by reference in its entirety: U.S. Pat. No. 7,416,989, titled "ADSORPTION BASED MATERIAL REMOVAL PROCESS"; U.S. Pat. No. 7,977,249, titled "METHODS OF REMOVING SILICON NITRIDE AND OTHER MATERIALS DURING FABRICATION OF CONTACTS"; U.S. Pat. No. 8,187,486, titled "MODULATING ETCH SELECTIVITY AND ETCH RATE OF SILICON NITRIDE THIN FILMS"; U.S. Pat. No. 7,981,763, titled "ATOMIC LAYER REMOVAL FOR HIGH ASPECT RATIO GAPFILL"; and U.S. Pat. No. 8,058,179, titled "ATOMIC LAYER REMOVAL PROCESS WITH HIGHER ETCH AMOUNT."

Figure 18:
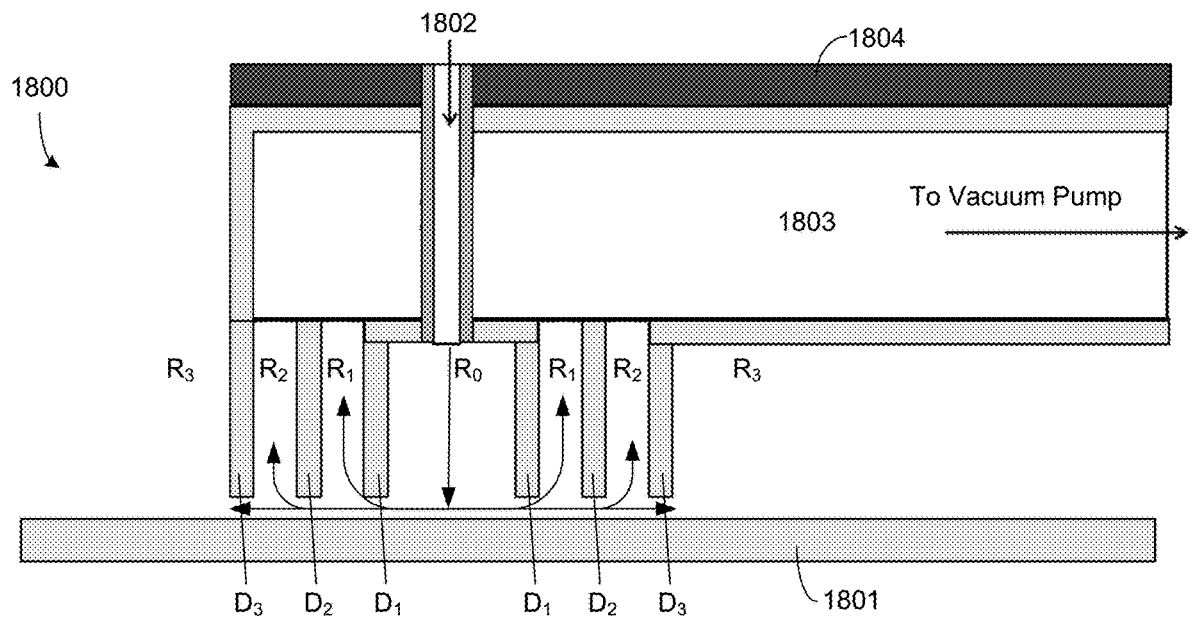
FIG. 18 illustrates one embodiment of an injection head used for delivering reactants at a local high pressure in certain embodiments.

FIG. 18 presents a simplified cross-sectional view of an injection head 1800 passing over a wafer 1801 according to certain embodiments. FIG. 18 shows the injection head 1800 and the components therein. The arrows show the flow of reactant gases. Reactant gases are introduced to the injection head 1800 at reactant inlet 1802. The reactant gases are introduced to the local high pressure region $R_0$ (also referred to as a reactant outlet region) at a relatively high pressure. A first divider $D_1$ separates the local high pressure region $R_0$ from the first pressure drop region $R_1$ (also referred to as a suction region), a second divider $D_2$ separates the first pressure drop region $R_1$ from the second pressure drop region $R_2$ (sometimes referred to as a second suction region), and a third divider $D_3$ separates the second pressure drop region $R_2$ from the surrounding substrate processing region $R_3$. The dividers may be sheets or other thin structures, and may be made of an etchant-resistant material such as a polymer, ceramic, metal, or glass. Example materials include aluminum, aluminum alloys, anodized aluminum, stainless steel, alumina ceramic, machinable glass ceramic, fused silica, inconel, monel, boro-silicate glass, vespel, Teflon or kapton, which may be chosen for the particular etchant(s) being used.

Vacuum is applied to the first and second pressure drop regions $R_1$ and $R_2$ in order to vacuum away excess reactant delivered to the local high pressure region $R_0$. The vacuum is applied through vacuum connection 1803. In a similar embodiment, the vacuum connection 1803 extends into and out of the page, rather than extending off to the right as shown in FIG. 18. In one embodiment the local high pressure region $R_0$ may be a cylindrically shaped region bounded on the sides by the first divider $D_1$. The first and second pressure drop regions $R_1$ and $R_2$ may be annularly shaped to surround the local high pressure region $R_0$. Alternatively, each of the local high pressure region $R_0$ and the first and second pressure drop regions $R_1$ and $R_2$ may be long and thin when viewed from above (e.g., each having a substantially rectangular cross-section as viewed from above), each extending into/out of the page.

Figure 19:
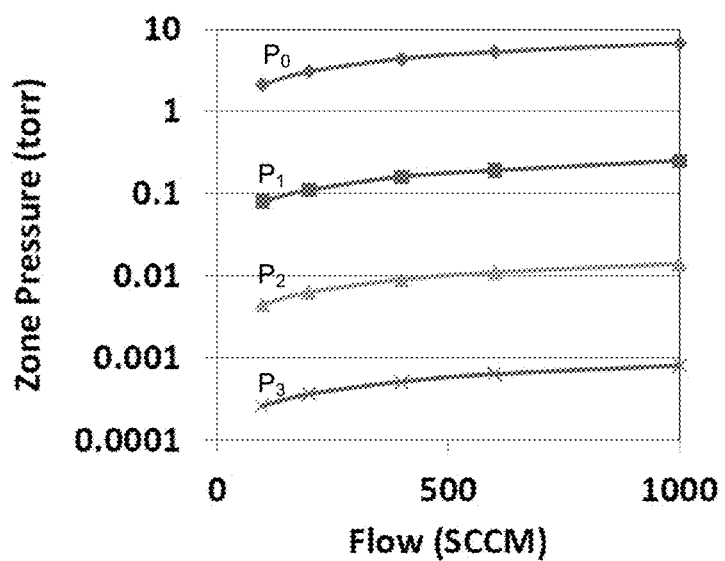
FIG. 19 is a graph illustrating the pressures experienced in the various regions of the reaction chamber and the injection head shown in FIG. 18.

FIG. 19 illustrates modeling results related to the pressure experienced in zones $R_0$-$R_3$. Specifically, the pressure $P_0$ corresponds to the pressure in region $R_0$ of FIG. 18, the pressure $P_1$ corresponds to the pressure in Region $R_1$ of FIG. 18, etc. The data are modeled assuming that the reactant delivered at high pressure is $N_2$ (larger molecules would result in even greater pressure drops). Further, the data are modeled assuming that the local high pressure region $R_0$ is about 5 cm wide, with the $R_1$ and $R_2$ areas about 1 cm wide, with each of the dividers $D_1$-$D_3$ about 1 cm wide, and about 1 cm, with a gap of about 1 mm between the lowermost surface of the injection head 1600 and the substrate 1601. The molecular/transition flow was calculated using slit conduction approximations based on the description in "A low conductance optical slit for windowless vacuum ultraviolet light sources" by R. A. George et al., Journal of Physics E: Scientific Instruments, Volume 4, Number 5 (1971). For any given flow rate modeled in FIG. 19, the pressure drops by more than an order of magnitude between adjacent regions of the injection head. As a result, the pressure drops from about 2 Torr at $P_0$ to about 0.00025 Torr at $P_3$, which represents an overall decrease of about 99.9875%. Another way to characterize the results is that the pressure drops by a factor of about 8,000 in this example.

Returning to the embodiment of FIG. 18, a sputter resistant coating 1804 may coat the injection head 1800. Such a sputter resistant coating 1804 may be made from carbon (e.g., amorphous carbon), or a material that, if sputtered, would not be considered a contaminate of the substrate material such as silicon, $SiO_2$, aluminum, or $Al_2O_3$, etc. The sputter resistant coating 1804 may help minimize the amount of material that is sputtered off of the injection head 1800. The injection head outer shell (under the sputter-resistant coating) may be made from a polymer, ceramic, metal, or glass, with examples including aluminum, aluminum alloys, anodized aluminum, stainless steel, alumina ceramic, machinable glass ceramic, fused silica, inconel, monel, boro-silicate glass, vespel, Teflon or kapton.

Another way to characterize the different relevant regions is by looking at what is happening on the wafer itself. The portion of the wafer located under the local high pressure region $R_0$ may be referred to as a local high pressure area (also referred to as the reactant outlet area). The portion of the wafer located under the pressure drop regions $R_1$ and $R_2$ may be referred to as a pressure drop area, or two pressure drop sub-areas. These areas may also be referred to as suction areas. The portion of the wafer that's not under the injection head may be referred to as the ion processing areas. The positions of the local high pressure area, the pressure drop area and the ion processing area change as the injection head moves over the surface of the wafer.

Those of ordinary skill in the art understand that any of a variety of shapes may be used in a structure or structures for creating the local high pressure region $R_0$ and the first and second pressure drop regions $R_1$ and $R_2$, so long as the pressure drop regions are designed or configured to vacuum away excess reactants and reactant byproducts after they are delivered to the local high pressure region $R_0$ and before they enter the substrate processing region $R_3$. As such, the first pressure drop region $R_1$ may surround or substantially surround the local high pressure region $R_0$, and the second pressure drop region $R_2$ may surround or substantially surround the first pressure drop region $R_1$. The regions may be round/cylindrical/annular, or they may be another shape (oval, square, rectangular, triangular, other polygonal shape, slit, etc.). The exposed area under $R_0$ may substantially smaller than the substrate, approximately equal to the substrate, or larger than the substrate.

In a particular example the local high pressure region is shaped as a relatively long and thin slit, and the pressure drop region abuts both sides of the slit. In this case, while the pressure drop region may or may not entirely surround the local high pressure region (e.g., near the thin sides of the slit), such a pressure drop region may be said to substantially surround the local high pressure region because a substantial majority of the excess reactants are vacuumed away by the pressure drop regions proximate the long sides of the slit-shaped local high pressure region. In certain embodiments, one or both pressure drop regions surround at least about 70% (or at least about 90%) of the perimeter of the reactant delivery region. In a particular case one or both pressure drop regions surround 100% of the perimeter of the reactant delivery region. In certain embodiments, the first pressure drop/suction region is directly adjacent to the local high pressure/reactant delivery region. In certain embodiments, the second pressure drop/suction region is directly adjacent the first pressure drop/suction region.

Figure 20A:
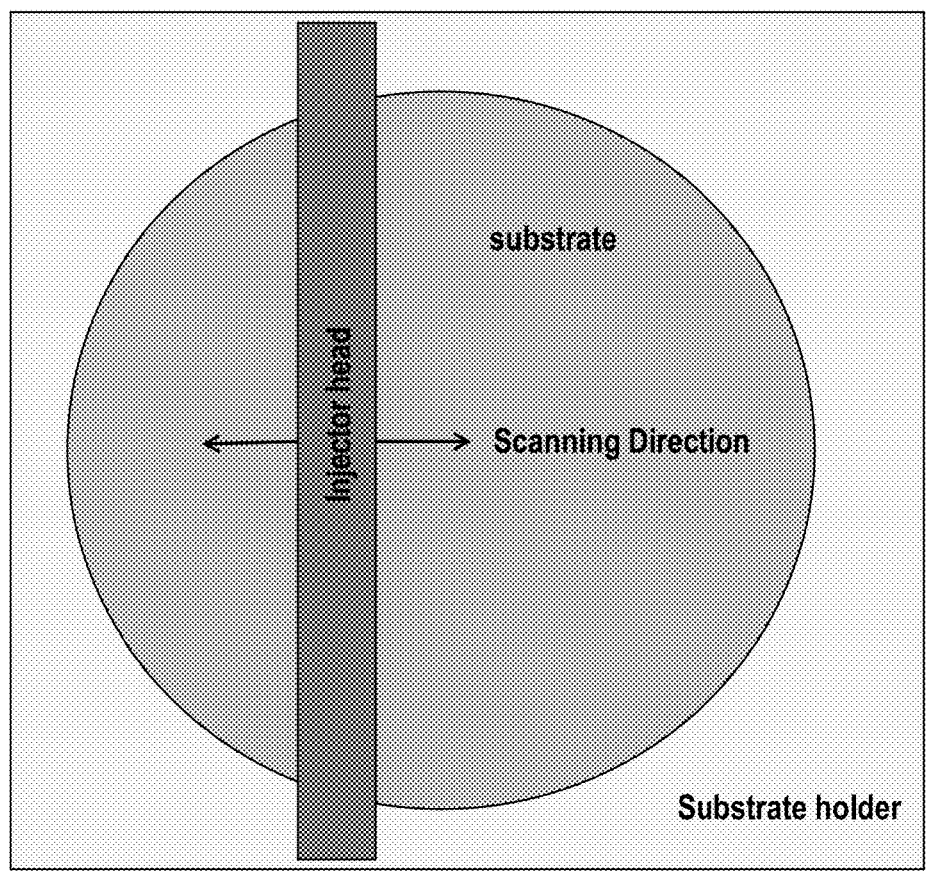
FIGS. 20A and 20B depict another embodiment of an injection head used for delivering reactants at a local high pressure in certain embodiments.
Figure 20B:
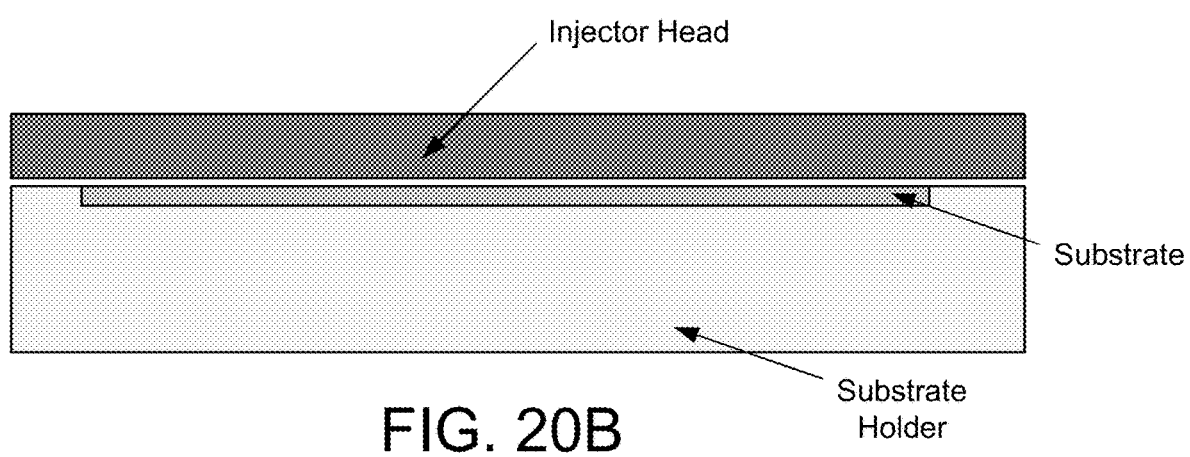

FIGS. 20A (top-down view) and 20B (cross-sectional view) illustrate an embodiment where the injection head is a thin slit. In various cases, the long length of the injection head extends the full length/diameter of the substrate, and the narrow width of the injection head extends a fraction of the substrate width, as shown. In this embodiment the injection head is scanned back and forth in the direction perpendicular to the long axis of the injection head so as to fully cover the substrate during each pass as shown in (e.g., in FIG. 20A the injection head scans left and right). In these or other cases, the injection head may have a length that is greater than or equal to the substrate physical length (e.g., equal to or greater than about 200 mm, 300 mm, or 450 mm in many cases). In various embodiments the injection head has a length that is between about 1 to 10 cm longer than the substrate length. The injection head may have a width that is between about 1 to 15 cm, for example between about 2 to 5 cm. The scanning of the head may be accomplished using a linear actuator, such movement shown in FIG. 20A or using or one more pivot points. The substrate may or may not be rotated under the injection head. In certain embodiments, the width of the injection head may be varied to compensate for scan speed or other variations that may occur, for example, in a single pivot head configuration (e.g., a distal portion of the head may be thicker than a proximal portion, the proximal portion being positioned closer to the pivot point). Additional pivot points may also be used. In the case of two pivot heads, the injector head can be scanned linearly across the substrate. As shown in FIG. 20B, the substrate holder may be configured such that the surface of the substrate and the surface of the substrate holder are substantially flush with one another when the substrate is present. This configuration minimizes or eliminates the risk that gas flowing from the injection head will escape into the general substrate processing region when the injection head is positioned at least partially off of the substrate.

Any number of separate pressure drop/suction regions may be used. While two pressure drop regions are shown in FIG. 18, in some embodiments only a single pressure drop region is used. In other embodiments, two or more pressure drop regions are used, for example three or more pressure drop regions. In some embodiments, up to about five pressure drop regions are used. The substrate processing region and the local high pressure region are not considered to be pressure drop regions. Typically, any pressure drop region will be located proximate a local high pressure region or another pressure drop region, and will have a vacuum connection for removing excess reactants. The pressure drop regions act to sequentially reduce the pressure between adjacent regions.

Design and use of injection heads for delivering reactants at local high pressures in the context of ion beam etching is further discussed and described in U.S. patent application Ser. No. 14/458,161, which is incorporated by reference above.

G. System Controller

The methods described herein may be performed by any suitable apparatus. A suitable apparatus includes hardware for accomplishing the process operations and a system controller having instructions for controlling process operations in accordance with the present invention. For example, in some embodiments, the hardware may include one or more process stations included in a process tool. At least one of the process stations may be a reaction chamber for etching substrates, as described herein. The reaction chamber may include the basic components shown in FIG. 2, as well as the additional components described herein. Such additional components may include, in various combinations, one or more electrodes with apertures that are off-center compared to apertures in other electrodes, an electrode with apertures that are hollow cathode emitters, coils for generating one or more magnetic fields, mechanisms for generating an electric field proximate the ion source, an injection head for delivering reactants at local high pressures, a controller with particular instructions, etc.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, electrode bias settings, frequency settings, current and magnetic field settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

III. Experimental

Figure 11A:
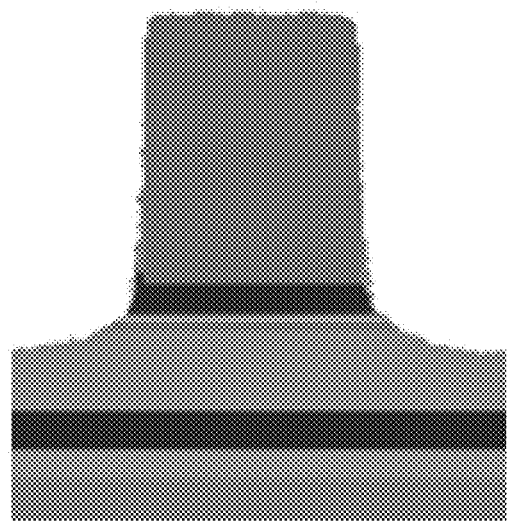
FIGS. 11A and 11B illustrate profile modeling results for substrates etched using different ion beam divergence and tilt conditions.
Figure 11B:
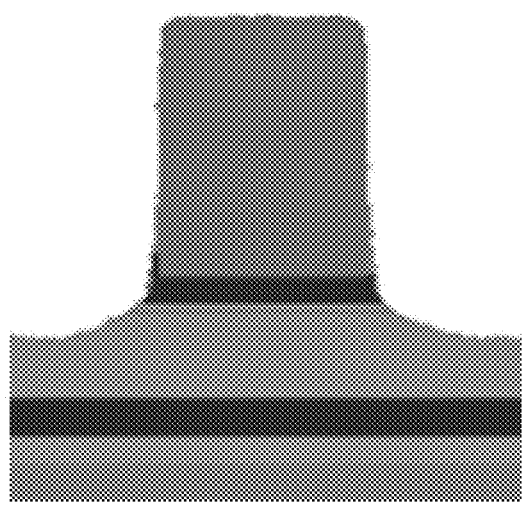

FIGS. 11A and 11B present modeling results related to certain etching processes.

The feature shown in FIG. 11A was modeled using an ion beam etching process utilizing ion beams with 4° divergence (i.e., low divergence), with 10° of tilt (e.g., accomplished by tilting the substrate holder), and rotation during etching. The feature shown in FIG. 11B was modeled using an ion beam etching process utilizing ion beams with 10° divergence (i.e., moderate divergence), with no substrate tilting or rotation during the etch. Notably, the features are etched to a very similar profile. These results suggest that divergent beams can be used to etch features without any need to rotate or tilt the substrate during etching.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. An ion beam etching apparatus for etching material on a substrate, the apparatus comprising:
    a reaction chamber;
    a substrate support in the reaction chamber;
    an ion source comprising:
        a plasma region for generating and/or maintaining a plasma, and
        an ion extractor positioned proximate the plasma region, the ion extractor comprising:
            a first electrode and a second electrode, each of the first and second electrodes comprising a plurality of apertures therein,
            sets of deflection plates provided below a lowermost electrode of the ion extractor, the lowermost electrode being one of the first and second electrodes, and
            a power supply configured to supply a bias potential to one or more of the first electrode and second electrodes,
            wherein the ion extractor is configured to generate a plurality of ion beams emanating from the plurality of apertures in the first and second electrodes, each ion beam having an ion beam trajectory;
    an injection head positioned over the substrate support and configured to deliver reactants at a local high pressure to the substrate simultaneous with the plurality of ion beams and configured to scan across a surface of the substrate; and
    a controller configured to cause:
        (a) generating electric fields between the deflection plates in each set of deflection plates, and passing the ion beams through the electric fields such that the ion beam trajectories are deflected to a non-normal angle with respect to the lowermost electrode of the ion extractor, each of the ion beams trajectories being deflected at the non-normal angle to reach to the substrate during etching, and
        (b) vary a strength of the electric fields between the deflection plates in each set of deflection plates to alter the ion beam trajectories such that the ion beams move with respect to the orientation of the substrate during etching.

2. The apparatus of claim 1, wherein the deflection plates are provided in one or more arrays of parallel conductive bars.

3. The apparatus of claim 2, wherein the deflection plates are provided in a first array of parallel conductive bars and a second array of parallel conductive bars, the first and second arrays of parallel conductive bars being oriented perpendicular to one another.

4. The apparatus of claim 1, wherein the deflection plates are provided as conductive plates at least partially positioned within holes in an insulating plate.

5. The apparatus of claim 1, further comprising one or more electromagnetic coils positioned outside the reaction chamber to generate a magnetic field between the lowermost electrode of the ion extractor and the substrate support, wherein in the controller is further configured to vary a strength of the magnetic field between the lowermost electrode of the ion extractor and the substrate support to alter the ion beam trajectories in a region between the ion source and the substrate support.

6. The apparatus of claim 1, wherein the substrate support is not configured to tilt the substrate during etching.

7. The apparatus of claim 1, wherein the substrate support is not configured rotate the substrate during etching.

8. The apparatus of claim 1, further comprising a hollow cathode emitter electrode.

9. The apparatus of claim 1, wherein the injection head comprises a reactant delivery region and a vacuum region that surrounds, substantially surrounds, or abuts the reactant delivery region.

10. The apparatus of claim 1, wherein the ion beam trajectories emanating from the sets of deflection plates are deflected in a direction parallel to one another.

11. An ion beam etching apparatus for etching material on a substrate, the apparatus comprising:
    a reaction chamber;
    a substrate support in the reaction chamber;
    an ion source comprising:
        a plasma region for generating and/or maintaining a plasma, and
        an ion extractor positioned proximate the plasma region, the ion extractor comprising:
            a first electrode and a second electrode, each of the first and second electrodes comprising a plurality of apertures therein, and
            a power supply configured to supply a bias potential to one or more of the first and second electrodes,
            wherein the ion extractor is configured to generate a plurality of ion beams emanating from the plurality of apertures in the first and second electrodes, each ion beam having an ion beam trajectory;
    sets of electromagnetic coils positioned around an outer periphery of the reaction chamber and configured to generate a first magnetic field proximate the ion source;
    an injection head positioned over the substrate support and configured to deliver reactants at a local high pressure to the substrate simultaneous with the plurality of ion beams and configured to scan across a surface of the substrate; and
    a controller configured to cause:
        (a) generating the first magnetic field while generating the ion beams such that the ion beam trajectories are deflected to a non-normal angle with respect to a lowermost electrode of the ion extractor, the lowermost electrode being one of the first and second electrodes, and
(b) vary a strength of the first magnetic field proximate the ion source to alter the ion beam trajectories such that the ion beams move with respect to the orientation of the substrate during etching.

12. The apparatus of claim 11, further comprising sets of additional electromagnetic coils positioned around an outer periphery of the reaction chamber to generate a second magnetic field between the ion source and the substrate support, the sets of additional electromagnetic coils being positioned in a lower portion of the apparatus and the sets of electromagnetic coils being positioned in an upper portion the apparatus, wherein the controller is configured to vary a strength of the second magnetic field between the ion source and the substrate support to move the ion beams with respect to the orientation of the ion source and substrate.

13. The apparatus of claim 11, wherein the substrate support is not configured to tilt the substrate during etching.

14. The apparatus of claim 11, wherein the substrate support is not configured rotate the substrate during etching.

15. The apparatus of claim 11, further comprising a hollow cathode emitter electrode.

16. The apparatus of claim 11, wherein the injection head comprises a reactant delivery region and a vacuum region that surrounds, substantially surrounds, or abuts the reactant delivery region.

17. The apparatus of claim 11, wherein ion beams emanating from apertures in the lowermost electrode emanate parallel to one another.

18. An ion beam etching apparatus for etching material on a substrate, the apparatus comprising:
a reaction chamber;
a substrate support in the reaction chamber;
an ion source comprising:
   a plasma region for generating and/or maintaining a plasma, and
   an ion extractor positioned proximate the plasma region, the ion extractor comprising:
      a first electrode and a second electrode, each of the first and second electrodes comprising a plurality of apertures therein, and
      a power supply configured to supply a bias potential to one or more of the first and second electrodes,
   wherein the ion extractor is configured to generate a plurality of ion beams emanating from the plurality of apertures in the first and second electrodes, each ion beam having an ion beam trajectory;
an injection head positioned over the substrate support and configured to deliver reactants at a local high pressure to the substrate simultaneous with the plurality of ion beams and configured to scan across a surface of the substrate; and
a controller configured to cause:
   (a) generating the ion beams such that a direction of the ion beam trajectories is deflected at a non-normal angle with respect to a lowermost electrode of the ion extractor, the lowermost electrode being one of the first electrode and second electrode;
   (b) altering the direction of the ion beam trajectories such that the ion beams move with respect to the orientation of the substrate during etching, wherein the direction of each ion beam trajectory is along the centerline of the ion beam; and
   (c) maintaining the reaction chamber below a processing pressure, wherein the local high pressure is at least 10 times higher than the processing pressure.

* * * * *